(12) United States Patent
Nishi

(10) Patent No.: US 6,704,090 B2
(45) Date of Patent: Mar. 9, 2004

(54) EXPOSURE METHOD AND EXPOSURE APPARATUS

(75) Inventor: Kenji Nishi, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/852,324

(22) Filed: May 10, 2001

(65) Prior Publication Data

US 2001/0055103 A1 Dec. 27, 2001

(30) Foreign Application Priority Data

May 11, 2000 (JP) ........................................ 2000-138684

(51) Int. Cl.$^7$ .......................... G03B 27/42; G03B 27/72
(52) U.S. Cl. .............................. 355/53; 355/69; 355/71
(58) Field of Search .............................. 355/52–53, 55, 355/67–71; 250/548; 356/399–401

(56) References Cited

U.S. PATENT DOCUMENTS

| | | | |
|---|---|---|---|
| 4,516,852 A | 5/1985 | Liu et al. | |
| 4,598,197 A | 7/1986 | Morita et al. | 250/205 |
| 5,237,367 A | 8/1993 | Kudo | |
| 5,305,054 A | 4/1994 | Suzuki et al. | |
| 5,486,896 A | 1/1996 | Hazama et al. | 355/71 |
| 5,499,100 A | 3/1996 | Tanaka | |
| 5,581,075 A | 12/1996 | Naraki et al. | 250/205 |
| 5,591,958 A | 1/1997 | Nishi et al. | |
| 5,615,047 A | 3/1997 | Komatsuda et al. | 359/618 |
| 5,684,566 A | 11/1997 | Stanton | |
| 5,841,520 A | 11/1998 | Taniguchi | |
| 5,895,737 A | 4/1999 | McCullough et al. | |
| 6,021,009 A | 2/2000 | Borodovsky et al. | |
| 6,051,842 A | 4/2000 | Yamamoto | 250/548 |
| 6,078,381 A | 6/2000 | Suzuki | 355/53 |
| 6,127,095 A | 10/2000 | Kudo | |
| 6,211,944 B1 | 4/2001 | Shiraishi | 355/53 |
| 6,259,510 B1 * | 7/2001 | Suzuki | 355/53 |
| 6,295,119 B1 * | 9/2001 | Suzuki | 355/53 |
| 6,325,516 B1 * | 12/2001 | Watanabe et al. | 359/601 |
| 6,333,777 B1 | 12/2001 | Sato | |
| 6,404,499 B1 | 6/2002 | Stoeldraijer et al. | 356/400 |
| 2001/0010579 A1 | 8/2001 | Nishi | |

FOREIGN PATENT DOCUMENTS

| | | |
|---|---|---|
| EP | 0 633 506 A1 | 1/1995 |
| EP | 0 869 396 A2 | 10/1998 |
| EP | 0 952 491 A3 | 10/1999 |
| EP | WO 99/53380 | 10/1999 |
| JP | 59-83165 | 5/1984 |
| JP | 61-190935 | 8/1986 |
| JP | 7-45502 | 2/1995 |
| JP | A 7-142313 | 6/1995 |
| JP | 10-27752 | 1/1998 |
| JP | 11-195597 | 7/1999 |
| JP | 11-317349 | 11/1999 |
| JP | 2000114164 A | 4/2000 |

\* cited by examiner

*Primary Examiner*—Henry Hung Nguyen
(74) *Attorney, Agent, or Firm*—Oliff & Berridge PLC

(57) ABSTRACT

An exposure apparatus transfers an image of a pattern on a reticle onto a wafer W by synchronously scanning the reticle and the wafer with respect to a projection optical system in a state in which the reticle is illuminated with an exposure light beam from an exposure light source subjected to pulse light emission via a fly's eye lens, a movable blind, a main condenser lens system, and a fixed blind. First and second uneven illuminance-correcting plates, on which shielding line groups for correcting convex and concave uneven illuminance are depicted, are arranged at a position defocused from a conjugate plane with respect to a pattern plane of the reticle. A third correcting plate for roughly correcting uneven illuminance is arranged at a position further defocused therefrom. It is possible to enhance the uniformity of the totalized exposure amount on the wafer or the telecentricity when the exposure is performed in accordance with the scanning exposure system.

52 Claims, 13 Drawing Sheets

EXPOSURE METHOD AND EXPOSURE APPARATUS

BACKGROUND OF THE INVENTION

1. Field of the Invention

The present invention relates to an exposure method and an exposure apparatus of the scanning exposure type to be used for transferring a mask pattern onto a substrate in the lithography step for producing devices including, for example, semiconductor elements, liquid crystal display elements, plasma display elements, micromachines, and thin film magnetic heads. In particular, the present invention is preferably used when a pulse light beam is used as an exposure light beam.

2. Description of the Related Art

In order to respond to the improvement in degree of integration and degree of fineness of the semiconductor device, it is demanded to enhance the resolving power and the transfer faithfulness for the exposure apparatus to be used for the exposure step in the lithography step (representatively comprising the resist application step, the exposure step, and the resist development step) in order to produce the semiconductor device. For this purpose, the numerical aperture of the projection optical system has been hitherto gradually increased. Further, the wavelength of the exposure light beam as the exposure beam has been shortened to use the KrF excimer laser (wavelength: 248 nm) and the ArF excimer laser (wavelength: 193 nm). In the present circumstances, only the pulse light source such as the excimer laser is available as the light source of the exposure light beam having the short wavelength as described above. Further, in order to enhance, for example, the resolving power, it is also necessary to enhance the exposure amount control accuracy to expose, with a proper exposure amount, the photoresist applied onto the wafer as the substrate.

Recently, in order to enhance the throughput in the exposure step by increasing the exposure field (respective shot areas on a wafer) without increasing the size of a projection optical system, a scanning exposure type exposure apparatus (hereinafter referred to as "scanning type exposure apparatus") based on the step-and-scan manner or the like has been developed, in which a reticle as a mask and the wafer are synchronously scanned with respect to the projection optical system. In the case of such a scanning type exposure apparatus, the totalized exposure amount at respective points on the wafer is averaged owing to the integration effect for the scanning direction. However, as for the non-scanning direction perpendicular to the scanning direction, for example, the influence of uneven illuminance in a slit-shaped illumination area in the non-scanning direction directly appears. As a countermeasure for this inconvenience, a method has been suggested, for example, in Japanese Patent Application Laid-Open No. 7-142313 and EP 0,633,506 A1 corresponding thereto. In this method, the shape of an opening of a field diaphragm, which defines the shape of the illumination area, is mechanically changed, or the field diaphragm is mechanically switched, in accordance with an actual totalized exposure amount.

As described above, the method for mechanically switching the shape of the field diaphragm in order to control the exposure amount in the scanning type exposure apparatus is considered to be effective when the exposure light beam is a continuous light beam such as a bright line (i-ray or the like) of a mercury lamp. However, in the present circumstances, a pulse light beam, which has a short wavelength with a relatively low oscillation frequency, is also used gradually in the scanning type exposure apparatus. When such a pulse light beam is used, in order to obtain a uniform totalized exposure amount, it is necessary to define the width of the exposure area on the wafer so that the exposure is performed substantially in an amount corresponding to an integral number of pulses at respective points on the wafer. In this case, if the shape of the opening of the field diaphragm is mechanically switched, it is feared that any area appears on the wafer, in which the condition of exposure in the amount corresponding to the integral number of pulses is not satisfied. Therefore, the method for mechanically switching the shape of the opening of the field diaphragm is not practical so much. For example, U.S. Pat. No. 6,078,381 discloses that the number of pulse light beams radiated onto respective points on the wafer is adjusted to be an integral number.

When the exposure light beam is an ultraviolet light beam, the following inconvenience sometimes arises. That is, any cloudiness gradually appears on a surface of an optical member for constructing the illumination optical system or the projection optical system, for example, due to the reaction between the exposure light beam and organic compounds in the atmosphere. As a result, the transmittance of the optical system is lowered over a long period of time. Further, the following phenomenon is also known. That is, when the exposure light beam is a pulse light beam in a vacuum ultraviolet region at a wavelength of not more than about 200 nm, the refractive member in the illumination optical system or the projection optical system is gradually deteriorated, for example, due to the so-called compaction. As a result, the transmittance is gradually varied. The variation of the transmittance also depends on the optical path for the exposure light beam. Therefore, for example, if the state, in which the distribution of the exposure light beam on the pupil plane is non-axisymmetric (asymmetric with respect to an axis), is continued, for example, when the so-called modified illumination method is used, the variation of the transmittance of the refractive member is also non-axisymmetric. As a result, it is feared that the distribution of illuminance is not uniform in the non-scanning direction in the illumination area (or the exposure area), and the unevenness of the totalized exposure amount is increased. Further, if the variation of the transmittance occurs about the center of any point other than those disposed on the optical axis, it is also feared that the collapse amount of the telecentricity (telecentric property) of the exposure light beam with respect to the reticle or the wafer exceeds an allowable range.

As described above, for example, if any time-dependent variation of the transmittance distribution occurs due to the cloudiness or the deterioration of the optical member, and the illuminance distribution in the illumination area (or the exposure area) is nonuniform in the non-scanning direction, then the nonuniformity can be improved by exchanging the concerning optical member. However, it takes a fairly long period of time to perform the exchange. Further, it is also conceived that any mechanism for exchanging the optical member is provided. However, in such a case, the exposure apparatus has a large size, and the production cost is increased as well.

SUMMARY OF THE INVENTION

Taking the foregoing viewpoints into consideration, a first object of the present invention is to provide an exposure method which makes it possible to enhance the uniformity of a totalized exposure amount on a wafer or the telecentricity of a exposure light beam when the exposure is performed in accordance with the scanning exposure system.

A second object of the present invention is to provide an exposure method which makes it possible to enhance the uniformity of a totalized exposure amount on a wafer when the scanning exposure is performed by using a pulse light beam as an exposure light beam.

A third object of the present invention is to provide an exposure method which makes it possible to easily enhance the uniformity of a totalized exposure amount on a wafer or the telecentricity of a exposure light beam even in the case of the occurrence of any variation in optical characteristic of an optical member or an optical system on an optical path of the exposure light beam up to the wafer, for example, any variation in transmittance (including variation in reflectance) when the exposure is performed in accordance with the scanning exposure system.

Still another object of the present invention is to provide an exposure apparatus which makes it possible to use the exposure method as described above, and a method for producing highly accurate devices based on the use of the exposure method.

A first exposure method according to the present invention lies in an exposure method for exposing a substrate with an exposure light beam by illuminating a mask (R) with the exposure light beam and synchronously scanning the mask and the substrate (W); the exposure method comprising controlling a transmittance with respect to the exposure light beam with a predetermined distribution in a non-scanning direction (X direction) intersecting a scanning direction (Y direction) for the substrate.

According to the present invention as defined above, for example, when the transmittance of a transmissive member or the reflectance of a reflective member of an exposure light beam-radiating system (for example, an illumination system or a projection system), and the entire transmittance ranging, for example, from a position for monitoring the energy of the exposure light beam to the substrate is gradually varied, then the transmittance for the exposure light beam is controlled with such a distribution as to offset the variation amount in the non-scanning direction thereof. Accordingly, the uneven illuminance in the non-scanning direction on the substrate is decreased. Consequently, the uniformity of the totalized exposure amount after the scanning exposure on the substrate is improved. Further, for example, when the transmittance for the exposure light beam is varied about the center of the point deviated from the optical axis, the telecentricity of the exposure light beam is changed on the mask or the substrate. Therefore, the transmittance for the exposure light beam is controlled so that the transmittance variation is offset. Accordingly, even when the height of the mask or the substrate is changed, for example, no positional deviation occurs in the projected image.

In the present invention, when the exposure light beam is a pulse light beam, it is desirable that a width in the scanning direction for the substrate in an exposure area (35P) of the exposure light beam on the substrate is determined so that the exposure light beam is radiated substantially as an integral number of pulses with respect to any point as an exposure objective during a period in which the point as the exposure objective on the substrate passes over the exposure area. When the scanning exposure is performed while increasing the scanning velocity of the substrate in order to increase the throughput under a condition in which the frequency of the pulse light beam is not so high, for example, when an excimer laser light beam is used as the exposure light beam, it is feared that the unevenness of the totalized exposure amount of a degree corresponding to about one pulse at the maximum occurs on the substrate, unless the exposure is performed in an amount corresponding to an identical integral number of pulses for the respective points on the substrate. In relation to such a situation, the width of the exposure area in the scanning direction is fixed in the present invention, and the transmittance itself for the exposure light beam is controlled. Therefore, it is possible to simultaneously satisfy both the condition to perform the exposure with the integral number of pulses and the control of the uneven illuminance in the non-scanning direction.

It is desirable that the transmittance for the exposure light beam is controlled after uniformity of an illuminance distribution of the exposure light beam is enhanced by the aid of one stage of optical integrator (uniformizer or homogenizer) or a plurality of stages of optical integrators (6, 9). For example, the time-dependent variation of the transmittance distribution of the radiating system can be corrected easily and highly accurately by controlling the transmittance after the passage through the optical integrator as described above.

It is desirable that uneven illuminance in the non-scanning direction of the exposure light beam with respect to the substrate is corrected by controlling the transmittance for the exposure light beam by varying the distribution of the transmittance for the exposure light beam in the non-scanning direction. Even when any uneven illuminance of the exposure light beam occurs in the scanning direction on the substrate, any unevenness of the totalized exposure amount is not substantially caused owing to the integration effect brought about by the scanning exposure. On the contrary, the integration effect is not exerted in the non-scanning direction of the substrate. Therefore, the uniformity of the totalized exposure amount in the non-scanning direction is improved by previously avoiding any occurrence of the uneven illuminance in the non-scanning direction.

Further, the transmittance for the exposure light beam may be previously allowed to have a predetermined variable distribution in the scanning direction for the substrate as well. The collapse amount of the telecentricity of the exposure light beam with respect to the mask or the substrate may be corrected by controlling the transmittance for the exposure light beam. The totalized exposure amount is scarcely affected even when the transmittance distribution is provided in the scanning direction. However, it is possible to correct the collapse amount of the telecentricity in the scanning direction.

In order to control the transmittance for the exposure light beam as described above, for example, it is desirable that the exposure light beam is partially shielded with a transmittance distribution control member (23A, 23B) which has a variable transmittance distribution in the non-scanning direction for the substrate, in an area defocused by a predetermined spacing distance with respect to a plane of a pattern formed on the mask (a pattern plane of the mask) or a conjugate plane conjugate with the pattern plane. The image of the shielding pattern of the transmittance distribution control member is fuzzy (becomes blur) on the mask by partially shielding the exposure light beam in the area defocused from the pattern plane of the mask (or the conjugate plane therewith) as described above. Therefore, the exposure light beam is successively radiated substantially uniformly onto all of the points on the substrate. Thus, the uniformity of the totalized exposure amount distribution is improved.

For example, it is desirable that the transmittance distribution control member is provided with a first set of a plurality of shielding lines (28A, 29A) in each of which a shielding area is changed in a predetermined distribution in the non-scanning direction for the substrate, and a second set of a plurality of shielding lines (28B, 29B) each of which has substantially the same shape as that of the shielding line of the first set; and any one of the following operations is selectively used, i.e., the operation in which the first set of the shielding lines and the second set of the shielding lines are inserted/withdrawn substantially symmetrically in the scanning direction for the substrate with respect to the optical path of the exposure light beam, and the operation in which the plurality of shielding lines of the first set and the second set are moved in the non-scanning direction for the substrate respectively. For example, the shielding line may be an aggregate of minute dot patterns, or it may be a semitransparent pattern for transmitting the exposure light beam to some extent.

The axisymmetric convex uneven illuminance or the concave uneven illuminance can be corrected without affecting the telecentricity by inserting/withdrawing the two sets of the shielding lines substantially symmetrically in the scanning direction. On the other hand, the convex or concave uneven illuminance deviated from the optical axis or the uneven illuminance inclined in the non-scanning direction can be corrected by moving the two sets of the shielding lines in the non-scanning direction respectively.

It is desirable that the first set of the plurality of shielding lines (28A, 29A) are arranged at a pitch which is gradually changed in the scanning direction for the substrate. Accordingly, the occurrence of any diffraction pattern (i.e., uneven illuminance) of the exposure light beam is avoided, which would be otherwise caused by the plurality of shielding lines. The same or equivalent effect is also obtained by slightly inclining the plurality of shielding lines arranged at a substantially constant pitch with each other.

When the exposure light beam is a pulse light beam, it is desirable that the first set of the plurality of shielding lines are arranged at different pitches therebetween which are different respectively from a length obtained by converting a spacing distance of movement of the substrate during each cycle of pulse light emission of the exposure light beam into a spacing distance at a position of each of the first set of the plurality of shielding lines. Accordingly, it is possible to avoid any transfer of a defocused image of a certain shielding line onto the substrate.

It is desirable that the transmittance distribution control member further comprises a third set of a plurality of shielding lines (26A to 26C, 27A to 27C) which have a large amount of change of a shielding area in the non-scanning direction for the substrate as compared with the first set and the second set of the plurality of shielding lines; and the third set of the plurality of shielding lines are moved in at least one of the scanning direction and the non-scanning direction for the substrate with respect to the optical path of the exposure light beam, in order to roughly correct any uneven illuminance of the exposure light beam in the non-scanning direction.

A second exposure method according to the present invention lies in an exposure method for exposing a substrate with an exposure light beam by illuminating a mask with the exposure light beam and scanning the substrate across the exposure light beam via the mask, the exposure method comprising:

measuring uneven illuminance on a substrate plane or at a position in the vicinity thereof;

controlling an illuminance distribution of the exposure light beam in a non-scanning direction intersecting a scanning direction for the substrate on an optical path of the exposure light beam on the way to the substrate to correct the measured uneven illuminance; and synchronously moving the mask and the substrate with respect to the exposure light beam to scan the substrate across the exposure light beam in which the uneven illuminance is corrected. According to this exposure method, the measured uneven illuminance in the non-scanning direction is effectively corrected by controlling the illuminance distribution of the exposure light beam.

In still another aspect, a first exposure apparatus according to the present invention lies in an exposure apparatus for exposing a substrate with an exposure light beam via a pattern on a mask by illuminating the mask (R) with the exposure light beam from an exposure light source (1) and synchronously scanning the mask and the substrate (W); the exposure apparatus comprising a transmittance distribution control member (23A, 23B, 24) which is arranged in an area defocused by a predetermined spacing distance with respect to a pattern plane of the mask or a conjugate plane conjugate with the pattern plane and which partially shields the exposure light beam with a variable transmittance distribution in a non-scanning direction intersecting a scanning direction for the substrate; and a driving unit (20) which drives the transmittance distribution control member in order to control the transmittance distribution in the non-scanning direction for the exposure light beam. The exposure method of the present invention can be carried out by using the exposure apparatus as defined above.

It is desirable that the exposure light source is a pulse light source; the apparatus further comprises a fixed field diaphragm (17) which is arranged on a plane defocused by a spacing distance smaller than a defocus amount of the transmittance distribution control member with respect to the pattern plane of the mask or the conjugate plane conjugate with the pattern plane; and a width of the field diaphragm in a direction corresponding to the scanning direction for the substrate is determined so that the exposure light beam is radiated substantially as an integral number of pulses to any point as an exposure objective during a period in which the point as the exposure objective on the substrate passes over an image of the field diaphragm.

It is desirable that one stage or a plurality of stages of optical integrators (6, 9) are arranged between the exposure light source and the transmittance distribution control member.

It is desirable that the transmittance distribution control member is provided with a first set of a plurality of shielding lines (28A, 29A) in each of which a shielding area is gradually changed in the non-scanning direction for the substrate, and a second set of a plurality of shielding lines (28B, 29B) each of which has substantially the same shape as that of the shielding line of the first set. It is desirable that the transmittance distribution control member further comprises a third set of a plurality of shielding lines (26A to 26C, 27A to 27C) which have a large amount of change of a shielding area in the non-scanning direction for the substrate as compared with the first set and the second set of the plurality of shielding lines.

A second exposure apparatus according to the present invention lies in an exposure apparatus for exposing a substrate with an exposure light beam via a pattern on a mask by illuminating the mask with the exposure light beam and synchronously scanning the mask and the substrate; the exposure apparatus comprising a measuring unit which measures uneven illuminance of the exposure light beam in a non-scanning direction intersecting a scanning direction for the substrate; a shield plate which has a shielding pattern for adjusting an illuminance distribution of the exposure light beam in the non-scanning direction; a driving unit which drives the shield plate; and a control unit which displaces the shield plate in a path for the exposure light beam by controlling the driving unit so that the uneven illuminance is corrected. According to this exposure apparatus, the measured uneven illuminance in the non-scanning direction is effectively corrected by means of the shield plate for adjusting the illuminance distribution of the exposure light beam.

The second exposure apparatus may further comprise an exposure light source, wherein the exposure light source generates a pulse beam having an oscillation frequency which is less than 10 KHz. The plate may be formed with shielding patterns which extend in the non-scanning direction and which have different shielding areas in the non-scanning direction. The exposure apparatus may further comprise a memory which stores a previously determined relationship between the uneven illuminance and an uneven illuminance correction amount depending on a driving amount of the plate; and a telecentricity-measuring unit. It is desirable that the plate is arranged at a position at which an image of the pattern formed on the plate is defocused on a conjugate plane with respect to a pattern plane of the mask, and a defocus amount δZ satisfies δZ>FD/(2·NA) with respect to a numerical aperture NA of the exposure light beam on the plate and a maximum line width FD of the shielding pattern in the scanning direction.

The exposure apparatus may further comprise a timer and a memory which stores a previously determined relationship between working time of the exposure apparatus and the uneven illuminance, wherein the control unit may correct the uneven illuminance by automatically controlling the driving unit depending on exposure time measured by the timer. The driving unit of the exposure apparatus may include a slider which is moved while holding each of the first, second, and third correcting plates, a guide with which the slider is engaged, and a motor which moves the slider.

In still another aspect, a third exposure method according to the present invention lies in an exposure method for exposing a substrate with an exposure light beam via a pattern on a mask by illuminating the mask (R) with the exposure light beam subjected to pulse light emission and synchronously scanning the mask and the substrate (W), wherein an illuminance distribution of the exposure light beam on the substrate is set to be trapezoidal with respect to a scanning direction of the substrate, and a width (DE) of an inclined portion (67Ba, 67Bb) of the trapezoidal illuminance distribution is set to be substantially an integral multiple of a distance of movement of the substrate in the scanning direction during a period of one cycle of the pulse light emission of the exposure light beam. As a result, the exposure light beam effects the exposure for respective points in a common amount of an integral number of pulses during the period in which the respective points on the substrate are moved over the inclined portion of the illuminance distribution during the scanning exposure. Therefore, the totalized exposure amount is made to be uniform.

In this arrangement, it is desirable that a shape of an exposure area brought about by the exposure light beam on the substrate is set so that a width (D(X)) is gradually changed with respect to a non-scanning direction intersecting the scanning direction for the substrate depending on a totalized exposure amount distribution on the substrate. The uniformity of the totalized exposure amount is improved by changing the width of the exposure area in the scanning direction so that the distribution of the totalized exposure amount in the non-scanning direction is constant.

A third exposure apparatus according to the present invention lies in an exposure apparatus for illuminating a mask with an exposure light beam and exposing a substrate with the exposure light beam via the mask, the exposure apparatus comprising:

an illuminance-correcting member which is arranged in an area defocused with respect to a conjugate plane conjugate with the substrate and which partially shields the exposure light beam with a variable transmittance distribution; and a control unit which sets the transmittance distribution of the exposure light beam so as to correct at least one of uneven illuminance and a collapse amount of telecentricity of the exposure light beam with respect to the mask or the substrate.

A fourth exposure method according to the present invention lies in an exposure method for exposing a substrate with an exposure light beam via a mask by relatively moving the mask and the substrate with respect to the exposure light beam subjected to pulse oscillation, wherein:

an illuminance distribution of the exposure light beam concerning a scanning direction for the substrate is set to be substantially trapezoidal, a width of the exposure light beam in the scanning direction is allowed to partially differ, and a scanning exposure condition for the substrate is set so that an integral number of pulses of the exposure light beam are radiated onto a point as an exposure objective during a period in which the point as the exposure objective on the substrate passes over an inclined portion of the illuminance distribution.

A method for producing a device according to the present invention comprises the step of transferring a device pattern (R) onto a workpiece (W) by using the exposure method of the present invention. The uniformity of the totalized exposure amount is improved by the present invention. Therefore, it is possible to highly accurately mass-produce devices having high degrees of integration.

DESCRIPTION OF THE PREFERRED EMBODIMENTS OF THE INVENTION

An exemplary embodiment according to the present invention will be explained below with reference to the drawings. In this embodiment, the present invention is applied when the exposure is performed by using a projection exposure apparatus (scanning type exposure apparatus) of the scanning exposure type based on the step-and-scan system.

Figure 1:
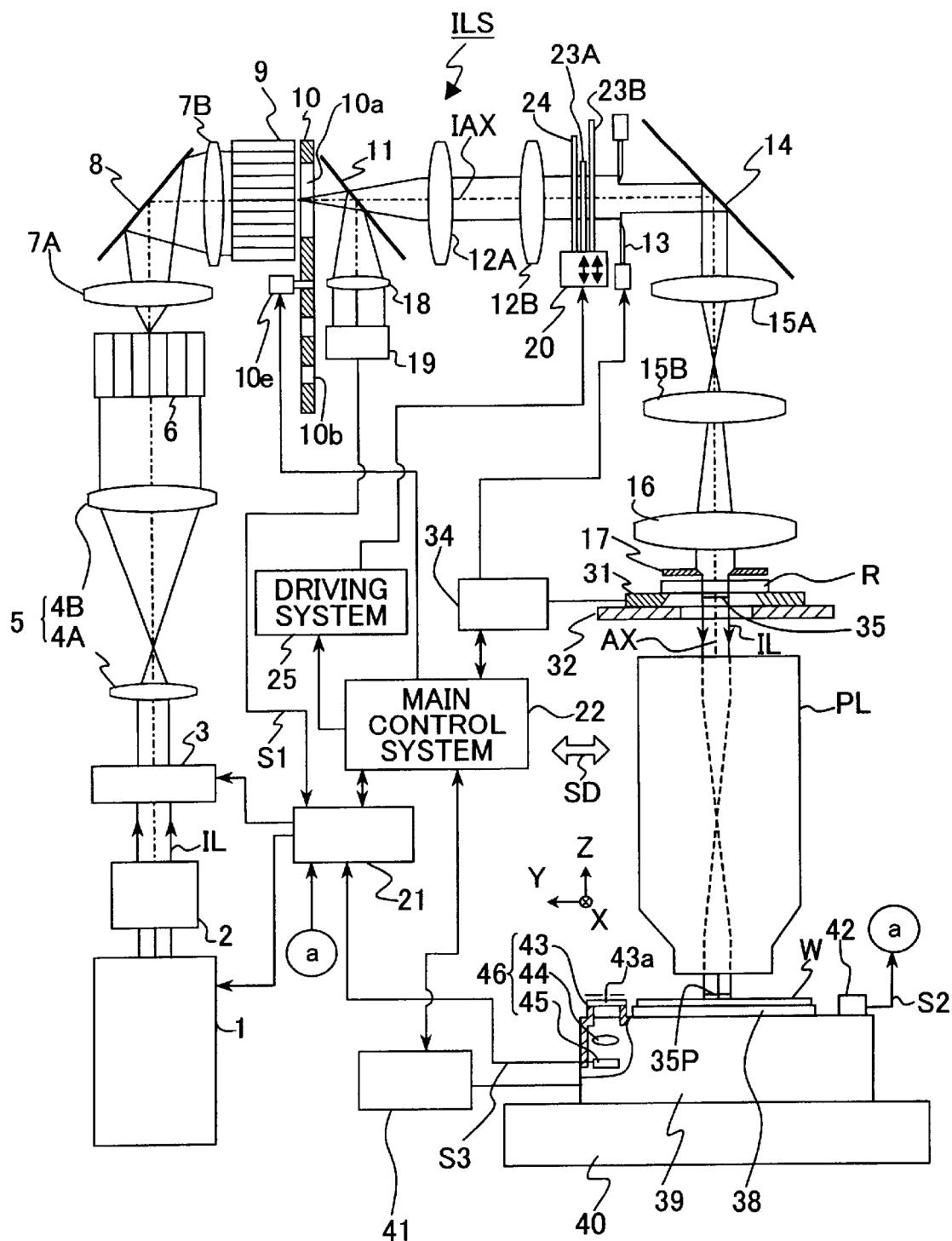
FIG. 1 shows, with partial cutaway, a front view illustrating an exemplary projection exposure apparatus according to an embodiment of the present invention.

FIG. 1 shows a schematic arrangement of the projection exposure apparatus of this embodiment. With reference to FIG. 1, an ArF excimer laser light source (wavelength: 193 nm) as a pulse light source is used for an exposure light source 1. However, those usable as the exposure light source 1 include, for example, a KrF excimer laser (wavelength: 248 nm), an $F_2$ laser (wavelength: 157 nm), a $Kr_2$ laser (wavelength: 146 nm), a high harmonic wave generator such as a YAG laser, and a light source unit for converting the wavelength of a light beam from a semiconductor laser up to a vacuum ultraviolet region at a wavelength of not more than about 200 nm by using a nonlinear optical crystal or the like after amplifying the light beam with an optical fiber amplifier. Any one of the light sources described above is a pulse light source. However, for example, the oscillation frequency of the excimer laser light source is about several kHz which is relatively low. On the other hand, the oscillation frequency of the light source unit for converting the wavelength of the light beam from the semiconductor laser can be increased, for example, to about 100 kHz, i.e., to such an extent that the light beam can be substantially regarded as a continuous light beam.

The exposure light beam IL (exposure beam) from the exposure light source 1, which is composed of an ultraviolet pulse light beam having a wavelength of 193 nm, passes through a beam-matching unit (BMU) 2 for positionally matching the optical path with respect to the main exposure apparatus body, and it comes into a variable light-reducing unit 3 as a light attenuator. An exposure control unit 21, which is provided to control the amount of exposure with respect to the photoresist on the wafer, controls the start, the stop, and the output (oscillation frequency and pulse energy) of the light emission of the exposure light source 1, and it adjusts the dimming ratio at the variable light-reducing unit 3 continuously or in a stepwise manner.

The exposure light beam IL, which has passed through the variable light-reducing unit 3, passes through a beam-shaping system 5 composed of a first lens system 4A and a second lens system 4B arranged along a predetermined optical axis, and it comes into a first fly's eye lens 6 which serves as a first stage optical integrator (uniformizer or homogenizer). The exposure light beam IL, which outgoes from the first fly's eye lens 6, passes along a first lens system 7A, an optical path-bending mirror 8, and a second lens system 7B, and it comes into a second fly's eye lens 9 which serves as a second stage optical integrator.

An aperture diaphragm plate 10 is arranged rotatably by the aid of a driving motor 10e at a light-outgoing plane of the second fly's eye lens 9, i.e., an optical Fourier transformation plane (pupil plane of the illumination system) with respect to the pattern plane (reticle plane) of the reticle R as the exposure objective. The aperture diaphragm plate 10 is switchably arranged with, for example, a circular aperture diaphragm 10a for ordinary illumination, an aperture diaphragm 10b for zonal illumination as an example of the modified illumination, an aperture diaphragm for four-spot illumination (not shown) composed of four eccentric small apertures as another example of the modified illumination, and a small circular aperture diaphragm (not shown) for a small coherence factor (σ value). An "illumination condition-switching system" is constructed to switch the illumination condition into any one of the plurality of illumination conditions (ordinary illumination, modified illumination, and small σ value illumination) by the aid of the aperture diaphragm plate 10 and the driving motor 10e. The main control system 22, which collectively manages and controls the entire operation of the apparatus, sets the illumination condition by the aid of the driving motor 10e.

When the modified illumination (zonal illumination, four-spot illumination) is performed, it is desirable that the cross-sectional configuration of the exposure light beam IL is shaped to have a substantially zonal area at the stage of incoming into the second fly's eye lens 9, in order to obtain the high illuminance (pulse energy) by increasing the efficiency of the use of the exposure light beam IL. For this purpose, for example, the first fly's eye lens 6 may be replaced with a diffractive optical element (DOE) composed of a set of a large number of phase type diffraction gratings. The illumination condition-switching system is not limited to the arrangement described above. A conical prism (axicon) and/or a zoom optical system and a diffractive optical element may be used singly or in combination with the aperture diaphragm plate 10. When an inner surface-reflecting type integrator (for example, a rod integrator) is used as the second stage optical integrator, then the exposure light beam IL is allowed to come into the inner surface-reflecting type integrator while inclining the exposure light beam IL with respect to the optical axis IAX of the illumination system by using, for example, DOE, a conical prism, or a polyhedral prism, and the range of the angle of incidence of the exposure light beam IL at the incoming plane is changed depending on the illumination condition.

In FIG. 1, the aperture diaphragm 10a for the ordinary illumination is installed at the light-outgoing plane of the second fly's eye lens 9. The exposure light beam IL, which outgoes from the second fly's eye lens 9 and which passes through the aperture diaphragm 10a, comes into a beam splitter 11 which has a high transmittance and a low reflectance. The exposure light beam, which is reflected by the beam splitter 11 as a monitoring point for the energy of the exposure light beam, passes through a light-collecting lens 18, and it comes into an integrator sensor 19 composed of a photoelectric detector. A detection signal S1 of the integrator sensor 19 is supplied to the exposure control unit 21. The exposure light beam IL is the pulse light beam. Therefore, the detection signal S1 is converted into digital data in the exposure control unit 21 by the aid of a peak hold circuit, and an analog/digital (A/D) converter. The relationship between the detection signal of the integrator sensor 19 and the illuminance of the exposure light beam IL on the wafer W as the substrate to be exposed is measured highly accurately, for example, periodically or if necessary, and it is stored in a memory in the exposure control unit 21. The exposure control unit 21 is constructed so that the illuminance (average value) of the exposure light beam IL on the wafer W and the integral value thereof can be indirectly monitored in accordance with the detection signal of the integrator sensor 19.

The exposure light beam IL, which has been transmitted through the beam splitter 11, passes through the first lens system 12A and the second lens system 12B along the optical axis IAX, and it successively comes into a movable blind (movable illumination field diaphragm) 13 via a rough uneven illuminance-correcting plate 24, a first uneven illuminance-correcting plate 23A, and a second uneven illuminance-correcting plate 23B as transmittance distribution control members or a shield plate of the present invention. As described later on, a plurality of predetermined shielding lines are depicted on the light-outgoing plane of the rough uneven illuminance-correcting plate 24. A plurality of shielding lines are depicted on opposing inner surfaces of the uneven illuminance-correcting plates 23A, 23B respectively. The positions of the rough uneven illuminance-correcting plate 24 and the uneven illuminance-correcting plates 23A, 23B in the plane perpendicular to the optical axis IAX are controlled by the driving mechanism 20 respectively. The operation of the driving mechanism 20 is controlled by the main control system 22 by the aid of the driving system 25. In this case, the latter movable blind 13 is installed at a conjugate plane with respect to the reticle plane. Each of planes on which the shielding lines are formed (the formation planes of the shielding lines) on the uneven illuminance-correcting plates 23A, 23B is defocused by a predetermined spacing distance from the conjugate plane in the optical axis direction (as described in detail later on).

In this arrangement, the formation planes of the shielding lines of the uneven illuminance-correcting plates 23A, 23B are opposed to one another so that the defocus amounts of the respective shielding lines of the uneven illuminance-correcting plates 23A, 23B are in the same degree substantially symmetrically with each other. Further, the spacing distance thereof is set to be narrow, i.e., for example, about 1 mm. Accordingly, an advantage is also obtained such that any foreign matter such as minute dust or the like hardly adheres to the formation plane of the shielding line. The formation plane of the shielding lines of the rough uneven illuminance-correcting plate 24 is further defocused with respect to the conjugate plane as compared with the uneven illuminance-correcting plates 23A, 23B.

During the exposure, the exposure light beam IL, which has passed through the movable blind 13, passes along an optical path-bending mirror 14, a lens system 15A for image formation, a subsidiary condenser lens system 15B, a main condenser lens system 16, and the movable blind 17, and it illuminates an illumination area (illumination field area) 35 of the pattern plane (reticle plane) of the reticle R as the mask. The fixed blind 17 is arranged at a plane which is slightly defocused from the reticle plane. That is, the defocus amount of the fixed blind 17 is set to be smaller than the defocus amount of each of the uneven illuminance-correcting plates 23A, 23B. For example, as disclosed in Japanese Patent Application Laid-Open No. 4-196513 and U.S. Pat. No. 5,473,410 corresponding thereto, the fixed blind 17 has an opening 17a (see FIG. 2B) which is arranged to extend in a linear slit-shaped configuration or a rectangular configuration (hereinafter generally referred to as "slit-shaped configuration") in a direction perpendicular to the scanning exposure direction at the center of the circular field of the projection optical system PL as described later on.

In this case, the movable blind 13 is used to vary the width of the illumination field area in the scanning direction in order to avoid any unnecessary exposure upon the start and the end of the scanning exposure for the respective shot areas on the wafer W. Further, the movable blind 13 is also used to vary the width depending on the size of the pattern area of the reticle R in relation to the direction (non-scanning direction) perpendicular to the scanning direction. The information on the opening ratio of the movable blind 13 is also supplied to the exposure control unit 21. The value, which is obtained by multiplying the illuminance determined from the detection signal of the integrator sensor 19 by the opening ratio, represents the actual illuminance on the wafer W.

With reference to FIG. 1, the illumination optical system ILS (illumination system) is constructed by the exposure light source 1, the beam-matching unit 2, the variable light-reducing unit 3, the beam-shaping system 5, the fly's eye lenses 6, 9, the lens systems 7A, 7B, the lens systems 12A, 12B, the movable blind 13, the lens system 15A for image formation, the subsidiary condenser lens system 15B, the main condenser lens system 16, the movable blind 17, the uneven illuminance-correcting plates 23A, 23B, the rough uneven illuminance-correcting plate 24, and other components. The fixed blind 17 may be arranged, for example, at the plane between the movable blind 13 and the uneven illuminance-correcting plates 23A, 23B, or at the plane in the vicinity of the light-outgoing side of the movable blind 13 (between the movable blind 13 and the mirror 14 in this embodiment).

As for another exemplary arrangement, the fixed blind 17 may be arranged at a plane in the vicinity of the lower surface of the reticle R, because the reticle plane of this embodiment is the lower surface of the reticle R. Alternatively, the fixed blind 17 may be arranged in the vicinity of the surface of the wafer W. The fixed blind 17 may be arranged at the conjugate plane conjugate with the surface of the wafer W (pattern plane of the reticle R). However, in this case, for example, it is necessary that a light-reducing section is formed for the fixed blind 17 so as to obtain a trapezoidal configuration of the illuminance distribution F(Y) of the exposure light beam IL concerning the scanning direction SD (Y direction in this embodiment) on the wafer W. Further, at least one of the uneven illuminance-correcting plates 23A, 23B and the rough uneven illuminance-correcting plate 24 may be arranged between the movable blind 13 and the lens system 15A for image formation, between the reticle R and the main condenser lens system 16, or between the reticle R and the projection optical system PL.

Under the illumination light beam IL, the image of the circuit pattern in the illumination area on the reticle R is transferred at a predetermined projection magnification β (β is, for example, ¼ or ⅕) through the projection optical system PL which is telecentric on both sides, to the slit-shaped exposure area 35P of the photoresist layer on the wafer W as the substrate (substrate to be exposed) arranged on the image formation plane of the projection optical system PL. The reticle R and the wafer W can be also regarded to be the first object and the second object respectively. The wafer W is, for example, a disk-shaped substrate of semiconductor (silicon or the like) or SOI (silicon on insulator). The projection optical system PL as the projection system of this embodiment is based on the dioptric system (refractive system). However, it is needless to say that the catadioptric system (reflective refractive system) and the reflective system are also usable.

In this case, the exposure light beam IL (ArF excimer laser beam) of this embodiment is the vacuum ultraviolet light beam. Therefore, the light beam is greatly absorbed, for example, oxygen, carbon dioxide, and steam existing in the ordinary air. In order to avoid such an inconvenience, a high purity purge gas (rare gas such as helium and neon or so-called inert gas such as nitrogen gas), which also has a high transmittance with respect to the vacuum ultraviolet light beam, is supplied to the optical path for the exposure light beam IL ranging from the exposure light source 1 to the wafer W of this embodiment. Further, the saltpeter material for the refractive member having the high transmittance with respect to the vacuum ultraviolet light beam is limited, for example, to synthetic quart, fluorite ($CaF_2$), and magnesium fluoride ($MgF_2$). However, fluorite and magnesium fluoride are expensive. Accordingly, most parts of the plurality of refractive members of the projection optical system PL of this embodiment are made of synthetic quartz. Remaining members for correcting the chromatic aberration are made of fluorite. Refractive members in the illumination optical system ILS are also made of synthetic quartz. The following explanation will be made assuming that the Z axis extends in parallel to the optical axis AX of the projection optical system PL, the Y axis extends in the scanning direction SD (direction parallel to the plane of paper of FIG. 1 in this embodiment) for the reticle R and the wafer W during the exposure in the plane perpendicular to the Z axis, and the X axis extends in the direction perpendicular to the scanning direction, i.e., the non-scanning direction in this embodiment (direction perpendicular to the plane of paper of FIG. 1 in this embodiment). On the reticle R, the optical axis IAX of the illumination optical system ILS coincides with the optical axis AX of the projection optical system PL.

In this embodiment, the reticle R is attracted and held on a reticle stage 31. The reticle stage 31 is placed on a reticle base 32 movably at a constant velocity in the Y direction and finely movably in the X direction, the Y direction, and the direction of rotation. The two-dimensional position and the angle of rotation of the reticle stage 31 (reticle R) are measured in real time by a laser interferometer installed in a driving control unit 34. A driving motor (for example, a linear motor or a voice coil motor) installed in the driving control unit 34 controls the scanning velocity and the position of the reticle stage 31 on the basis of an obtained result of the measurement and the control information supplied from the main control system 22.

On the other hand, the wafer W is attracted and held on the wafer stage 39 by the aid of the wafer holder 38. The wafer stage 39 is movable two-dimensionally along the XY plane parallel to the image plane of the projection optical system PL on the wafer base 40. That is, the wafer stage 39 is movable at a constant velocity in the Y direction on the wafer base 40, and it is movable in a stepping manner in the X direction and the Y direction during the shot exposure. The wafer stage 39 is further incorporated with a Z leveling mechanism for controlling the position of the wafer W in the Z direction (focus position) and the angles of rotation about the X axis and the Y axis as well. A multi-point autofocus sensor (not shown) for measuring the focus positions at a plurality of measuring points on the surface of the wafer W (wafer plane) is also provided. During the exposure, the Z leveling mechanism is driven in accordance with the autofocus system on the basis of the measured value obtained by the autofocus sensor. Accordingly, the wafer plane is focused to the image plane of the projection optical system PL.

The positions of the wafer stage 39 in the X direction and the Y direction, and the angles of rotation about the X axis, the Y axis, and the Z axis are measured in real time by the laser interferometer in the driving control unit 41. The driving motor (for example, a linear motor) in the driving control unit 41 controls the scanning velocity and the position of the wafer stage 39 on the basis of the obtained result of the measurement and the control information supplied from the main control system 22.

The main control system 22 sends various pieces of information including, for example, the movement positions, the movement velocities, the rates of acceleration of movement, and the position offsets of the reticle stage 31 and the wafer stage 39 respectively, to the driving control units 34, 41. During the scanning exposure, the reticle R is scanned at the velocity Vr in the +Y direction (or in the −Y direction) with respect to the illumination area 35 of the exposure light beam IL by the aid of the reticle stage 31, in synchronization with which the wafer W is scanned at the velocity β·Vr (β represents the projection magnification from the reticle R to the wafer W) in the −Y direction (or in the +Y direction) with respect to the exposure area 35P for the pattern image on the reticle R by the aid of the wafer stage 39. In order to avoid any exposure onto unnecessary portions at the start and the end of the scanning exposure during this process, the opening/closing operation of the movable blind 13 is controlled by the driving control unit 34.

Further, the main control system 22 reads, from the exposure data file, various exposure conditions for performing the scanning exposure in a proper exposure amount for the photoresist in each of the shot areas on the wafer W, and it executes the optimum exposure sequence in cooperation with the exposure control unit 21 as well. That is, when the command to start the scanning exposure for one shot area on the wafer W is issued from the main control system 22 to the exposure control unit 21, then the exposure control unit 21 starts the light emission of the exposure light source 1, and it calculates the integral value of the illuminance of the exposure light beam IL for the wafer W (sum of the pulse energy per unit time) by the aid of the integrator sensor 19. The integral value is reset to zero upon the start of the scanning exposure. The exposure control unit 21 successively calculates the integral value of the illuminance, and it controls the output of the exposure light source 1 (oscillation frequency and pulse energy) and the dimming ratio of the variable light-reducing unit 3 depending on an obtained result so that the proper exposure amount is obtained at respective points on the photoresist on the wafer W after the scanning exposure. The light emission of the exposure light source 1 is stopped after completion of the scanning exposure for the concerning shot area.

In this embodiment, the pulse light beam, which has a relatively low oscillation frequency (less than 10 kHz, for example, in a degree of about several kHz), is used as the exposure light beam IL. Therefore, a condition is imposed to perform the exposure with an integral number of pulses for the respective points on the wafer W. This means that the number of pulses radiated onto the respective points on the wafer W is an integral number. Further, the pulse energy involves dispersion to some extent every time when the light is emitted. Therefore, in order to maintain the control accuracy for the totalized exposure amount to be not less than a predetermined level, a condition is also imposed in this embodiment such that the number N of exposure pulses for the respective points on the wafer W is an integral number of not less than a predetermined minimum number $N_{min}$ of exposure pulses. In FIG. 1, when the exposure light beam IL is subjected to the pulse light emission, the illuminance distribution F(Y) in the scanning direction SD (Y direction) of the exposure area 35P on the wafer W has an approximately trapezoidal configuration as shown in FIG. 15C, because the fixed blind 17 is defocused.

Figure 15A:
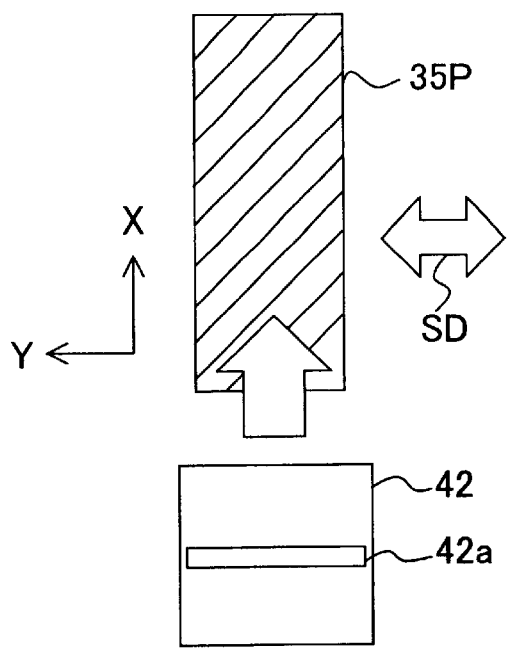
FIGS. 15A to 15C illustrate an exemplary method for measuring the illuminance distribution in the exposure area in the non-scanning direction according to the embodiment of the present invention.
Figure 15B:
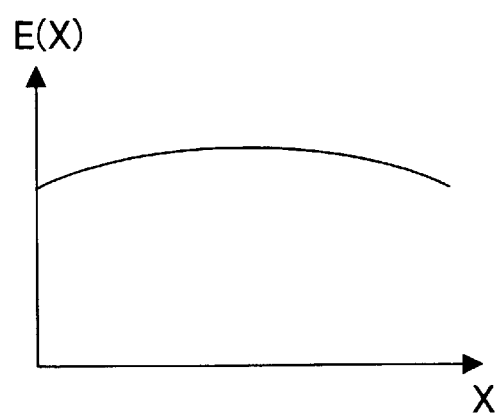
Figure 15C:
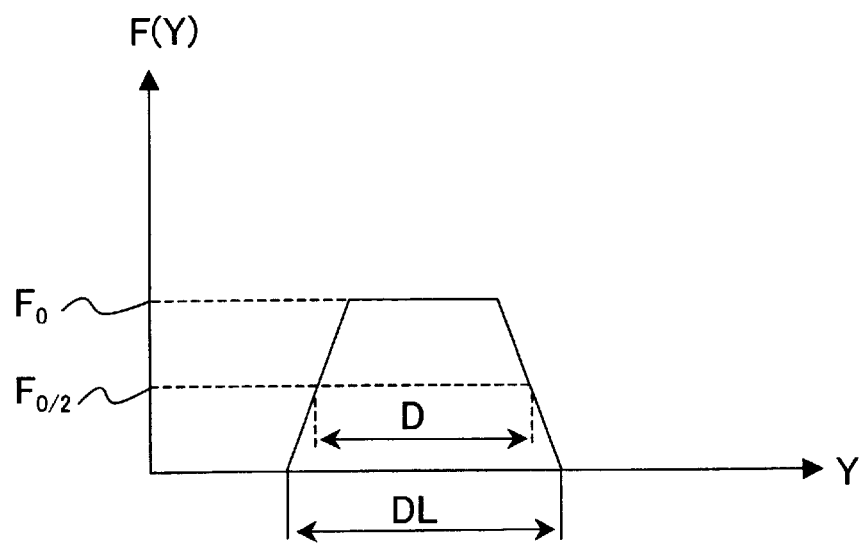

With reference to FIG. 15C, assuming that the value (maximum value) at the upper side of the illuminance distribution F(Y) is $F_0$, the width D in the scanning direction of the illuminance distribution F(Y) at the position at which the illuminance is $F_0/2$ is regarded to be the width (slit width) in the scanning direction of the exposure area 35P in this embodiment. The slit width D on the wafer is, for example, about 8 mm. The width of the exposure area 35P in the non-scanning direction is about 2.5 times (20 mm) to 4 times (32 mm) the slit width D. In this case, it is assumed that $f_{IL}$ represents the frequency of the pulse light emission of the exposure light source 1 shown in FIG. 1, $T_{IL}$ (=$1/f_{IL}$) represents the cycle, Vw represents the scanning velocity of the wafer stage 39 during the scanning exposure, PH represents the proper exposure amount (sensitivity) of the photoresist, N represents the number of exposure pulses (N is an integer) for the respective points on the wafer, and p represents the average value of the pulse energy (converted into the illuminance value) of the exposure light beam IL on the wafer. On this assumption, the condition to perform the exposure with the number N of pulses which is not less than the minimum number $N_{min}$ of exposure pulses is as follows.

$$N(\text{integer})=PH/p \geq N_{min} \tag{1}$$

Accordingly, for example, with reference to FIG. 1, the average pulse energy p on the wafer is indirectly measured by the aid of the integrator sensor 19 previously before the exposure. After that, the main control system 22 controls the dimming ratio of the variable light-reducing unit 3 and the output of the exposure light source 1 so that the expression (1) is satisfied by the aid of the exposure control unit 21.

Further, for example, the slit width D and the scanning velocity Vw satisfy the following condition.

$$D/Vw=N \cdot T_{IL} \tag{2}$$

When this expression is substituted with ($T_{IL}=1/f_{IL}$), the scanning velocity Vw is represented as follows.

$$Vw=D \cdot f_{IL} \cdot (p/PH) \tag{3}$$

In this case, the scanning exposure condition, which satisfies the expression (3), may be determined by adjusting at least one of the scanning velocity Vw (scanning velocity for the reticle R is Vw/β), the slit width D, the frequency $f_{IL}$, and the average value p of the pulse energy so that the throughput of the exposure apparatus is maximum, i.e., the scanning exposure time for each of the shot areas on the wafer W is shortest. Further, it is preferable that the scanning exposure condition is determined taking into consideration the variable range (for example, the maximum value) of at least one of the scanning velocity Vw the oscillation frequency $f_{IL}$, the pulse energy p and like. In this case, as for the scanning exposure condition, for example, the limit value based on the design of the apparatus may be used for the maximum value of the scanning velocity Vw or the oscillation frequency $f_{IL}$. However, it is desirable that the practical upper limit, with which, for example, the movement control (including, for example, the position control and the velocity accuracy) for the reticle R and the wafer W satisfies the required accuracy, is used for the scanning velocity, and the practical upper limit, with which, for example, the central wavelength of the pulse light beam, the stability of the wavelength width, and the intensity dispersion satisfy the required accuracy, is used for the oscillation frequency.

Synthetic quartz is principally used for the plurality of refractive members in the illumination optical system ILS and the projection optical system PL of this embodiment. It is known that when the intense pulse light beam is continuously radiated onto synthetic quartz, the transmittance thereof is gradually varied due to the deterioration of the material. As for other refractive members and reflective members, there is such a possibility that the overall transmittance is gradually varied due to the deterioration thereof. Further, in this embodiment, the purge gas, from which impurities such as organic matters are intensely removed, is supplied into the optical path for the exposure light beam IL. However, even on this condition, it is also considered that any cloudiness substance generated by the chemical reaction is deposited on the surface of the refractive member or the reflective member by slightly remaining impurities, resulting in gradual decrease in transmittance (or reflectance in the case of the reflective member). In such a case, when the variation of the transmittance uniformly occurs in the X direction and the Y direction, the uneven illuminance on the wafer W, as well as the uneven totalized exposure amount is not caused. In this embodiment, the exposure light beam IL, which is separated by the beam splitter 11 (monitoring point for the energy) in the illumination optical system ILS, is received by the integrator sensor 19. The obtained detection result is multiplied by a predetermined coefficient to indirectly determine the illuminance on the entire surface of the exposure area 35P on the wafer W. Therefore, when the transmittance of the optical system is gradually varied uniformly as a whole, it is possible to allow the average value of the totalized exposure amount with respect to the wafer W to coincide with the target sensitivity prescribed by the photoresist within an allowable range, for example, by periodically performing calibration for the coefficient.

However, for example, when the modified illumination is performed, the optical path for allowing the exposure light beam IL to pass therethrough in the illumination optical system ILS and the projection optical system PL is not a substantially uniform optical path about the center of the optical axis. Therefore, it is feared that the variation of the transmittance, which is caused by the cloudiness and the deterioration of the optical systems, is not uniform, for example, in the X direction (non-scanning direction). In such a case, the dispersion of the illuminance (pulse energy per unit area and unit time), i.e., the uneven illuminance occurs in the non-scanning direction in the illumination area 35 and the exposure area 35P. The dispersion (uneven exposure amount) also occurs in the totalized exposure amount after the scanning exposure in the respective shot areas on the wafer W. If the dispersion exceeds an allowable range, for example, the resolution is deteriorated, or the transfer faithfulness is lowered, finally resulting in the decrease in yield of the semiconductor device to be produced. Specifically, if no operation for correcting the uneven illuminance is performed, it is also postulated that the uneven illuminance exceeds the average illuminance by about ±5 to ±10% (10 to 20% in width) for a long period of time. Even if the variation of the transmittance occurs in the Y direction (scanning direction), the uneven exposure amount scarcely takes place owing to the integration effect brought about by the scanning exposure.

However, for example, if the transmittance variation occurs at a position (position close to the pupil plane) defocused from the conjugate plane with respect to the reticle plane about the center of the point which is different from those disposed on the optical axis, the collapse of telecentricity (hereinafter referred to as "telecentric discrepancy") occurs together with the uneven exposure amount. If the collapse amount exceeds an allowable range, for example, it is feared that any lateral discrepancy of the projected image occurs in an area in which the reticle plane is slightly bent downwardly or in an area in which slight irregularities exist on the surface of the wafer W. The lateral discrepancy results in the deterioration of the resolution, or the overlay error when the overlay exposure is performed. Accordingly, the projection exposure apparatus of this embodiment is incorporated with a mechanism for correcting the uneven illuminance caused by the variation of transmittance and the telecentric discrepancy as described above (hereinafter referred to as "uneven illuminance-correcting mechanism"). The uneven illuminance-correcting mechanism is provided with an uneven illuminance-measuring mechanism, a telecentricity-measuring mechanism, and a transmittance distribution control mechanism, as well as the main control system 22 and the exposure control unit 21 as the control system for them.

At first, as for the uneven illuminance-measuring mechanism, an illuminance-measuring section 42 is fixed in the vicinity of the wafer holder 38 on the wafer stage 39 shown in FIG. 1. A CCD type line sensor 42a (see FIG. 15A), which has a slit-shaped or slender light-receiving section extending in the scanning direction (Y direction), is fixed onto the upper surface of the illuminance-measuring section 42. A detection signal obtained by the line sensor 42a is supplied to the exposure control unit 21. An ordinary uneven illuminance sensor (not shown), which is composed of a photoelectric sensor having a pin hole-shaped light-receiving section, is also installed on the upper surface of the illuminance-measuring section 42. Although not shown, a radiation amount monitor, which has a light-receiving section to cover the entire exposure area 35P, is also installed on the wafer stage 39. A coefficient, which is used to indirectly determine the illuminance on the wafer W from the detection signal of the integrator sensor 19, is calculated on the basis of the detection signal S1 of the integrator sensor 19 and the detection signal of the radiation amount monitor.

Explanation will now be made with reference to FIG. 15 for a method for measuring the uneven illuminance of the slit-shaped exposure area 35P in the non-scanning direction (X direction) by using the line sensor 42a. The measurement of the uneven illuminance is performed, for example, periodically. During this process, the illumination system is switched, for example, into the ordinary illumination, the modified illumination, and the small a value illumination by driving the aperture diaphragm plate 10 shown in FIG. 1 to execute the measurement of the uneven illuminance for each of the illumination systems. The state of the uneven illuminance, which corresponds to the elapse of the working time of the projection exposure apparatus of this embodiment, is stored as a table for each of the illumination systems in a storage unit in the main control system 22.

FIG. 15A shows a state in which the wafer stage 39 shown in FIG. 1 is driven to move the line sensor 42a on the illuminance-measuring section 42 to a side in the non-scanning direction of the exposure area 35P of the projection optical system PL. The illuminance distribution F(Y) in the scanning direction SD (Y direction) of the exposure area 35P has a substantially trapezoidal configuration. As shown in FIG. 15C, assuming that the width in the scanning direction of the base of the illuminance distribution F(Y) is DL, the width of the light-receiving section of the line sensor 42a in the scanning direction is set to be sufficiently wider than DL.

After that, as shown in FIG. 15A, the wafer stage 39 is driven to successively move the line sensor 42a to a series of measuring points at predetermined intervals in the non-scanning direction (X direction) in a form in which the exposure area 35P is completely covered in the scanning direction. The exposure light source 1 shown in FIG. 1 is allowed to cause the pulse light emission at the respective measuring points to incorporate, in parallel, the detection signal S1 of the integrator sensor 19 and the detection signal S2 of the line sensor 42a into the exposure control unit 21. The data, which is obtained by integrating the digital data of the detection signal S2 of the line sensor 42a for all of pixels, is divided by the digital data of the detection signal S1. Accordingly, as shown in FIG. 15B, the illuminance distribution E(X) in the non-scanning direction (X) of the exposure area 35P is calculated. The reason why the data is divided by the detection signal S1 of the integrator sensor 19 is to eliminate the influence of the dispersion of the pulse energy. As described above, the illuminance distribution E(X) in the non-scanning direction of the exposure area 35P can be easily measured for a short period of time by scanning the line sensor 42a in the X direction. The illuminance distribution E(X) in this case is represented, for example, by a relative value on the basis of the illuminance at the first measuring point at the one end of the exposure area 35P in the non-scanning direction.

As a result, the illuminance distribution E(X) represents the illuminance obtained by integrating the illuminance on the exposure area 35P in the scanning direction (Y direction) at the respective positions X in the non-scanning direction. During the scanning exposure, the respective points on the wafer W traverse the area of the trapezoidal illuminance distribution F(Y) shown in FIG. 15C in the scanning direction. Therefore, the illuminance distribution E(X) in the non-scanning direction in this embodiment is approximately equivalent to the distribution of the totalized exposure amount in the non-scanning direction in the respective shot areas on the wafer W. In this embodiment, the illuminance distribution E(X) is expressed as follows as a function of the position X in the non-scanning direction. The origin for the position X resides in a straight line which passes through the optical axis AX of the projection optical system PL and which is parallel to the Y axis.

$$E(X) = a \cdot (X-b)^2 + c \cdot X + d \quad (4)$$

In the expression (4), the quadratic coefficient a represents the uneven illuminance which is convex (a>0) or which is concave (a<0) with respect to the position X. The shift coefficient b represents the shift amount of the symmetrical axis of the uneven illuminance in the X direction from the optical axis AX. The linear coefficient c represents the so-called uneven inclination. The coefficient d represents the constant illuminance (offset) independent from the position X. The values of the coefficients a to d are determined, for example, by means of the least square method from actually measured data. The determined values are stored as the state of the uneven illuminance in the non-scanning direction (i.e., the totalized exposure amount distribution in the non-scanning direction). Specifically, in the case of the illuminance distribution E(X) shown in FIG. 15B, the coefficient a is a positive value (convex uneven illuminance), the values of the coefficients b and c are zero, and the coefficient d is also a positive value. In this embodiment, the illuminance distribution E(X) is approximated by the quadratic function of the position X. However, E(X) may be approximated by a cubic function or a higher order function. Further, E(X) may be approximated, for example, by an exponential function.

Returning to FIG. 1, a scanning plate 43, which is composed of a glass substrate, is further installed in the vicinity of the wafer holder 38 on the wafer stage 39. A substantially square-shaped aperture pattern 43a is formed in a shielding film on the scanning plate 43. A light-collecting lens 44 and a photoelectric detector 45 are arranged on the bottom surface side of the scanning plate 43 in the wafer stage 39. A spatial image-measuring system 46, which serves as the telecentricity-measuring mechanism, is constructed by the scanning plate 43, the light-collecting lens 44, and the photoelectric detector 45. A detection signal S3 obtained by the photoelectric detector 45 is supplied to a calculating section in the exposure control unit 21. When the telecentricity of the exposure light beam IL with respect to the wafer W is measured, a test reticle, on which a plurality of predetermined evaluating marks are formed, is placed as the reticle R. The exposure light beam IL is subjected to the light emission to measure the positions of images of the evaluating marks in the X direction and the Y direction by using the spatial image-measuring system 46. After that, the focus position (position of the projection optical system PL in the direction of the optical axis AX) is changed by a predetermined spacing distance with the wafer stage 39, and then the positions of the images of the evaluating marks in the X direction and the Y direction are measured again. As a result, the telecentric discrepancy amounts in the X direction and the Y direction can be measured from the lateral discrepancy amounts of the images of the evaluating marks at the two focus positions. In place of the use of the test reticle, an image of a fiducial mark (not shown) formed on the reticle stage 31 may be detected with the spatial image-measuring system 46 to measure, for example, the telecentric discrepancy amount.

Next, detailed explanation will be made for the transmittance distribution control mechanism as a part of the uneven illuminance-correcting mechanism of this embodiment. With reference to FIG. 1, the transmittance distribution control mechanism is constructed by the uneven illuminance-correcting plates 23A, 23B, the rough uneven illuminance-correcting plate 24, the driving mechanism 20, and the driving system 25.

Figure 2A:
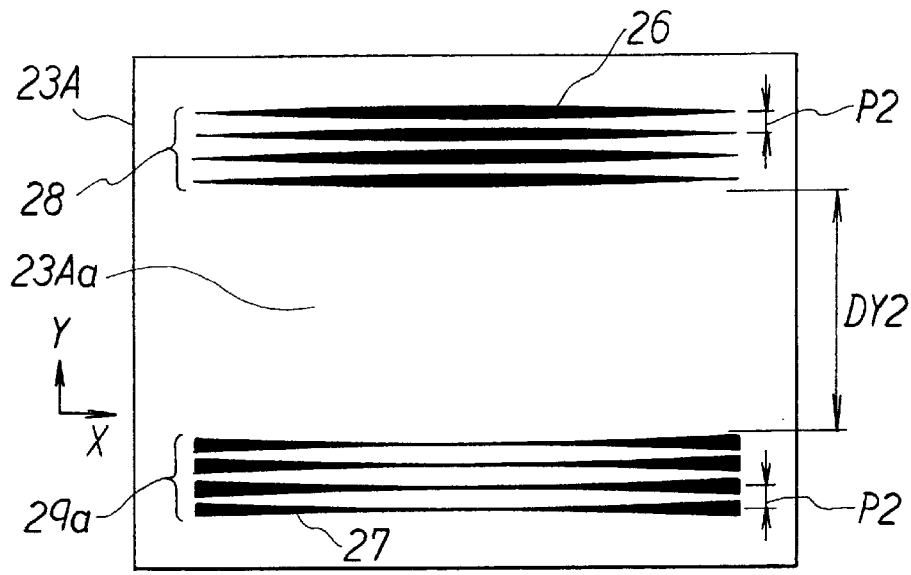
FIGS. 2A to 2C show plan views illustrating uneven illuminance-correcting plates 23A, 23B and a fixed blind 17 shown in FIG. 1.
Figure 2B:
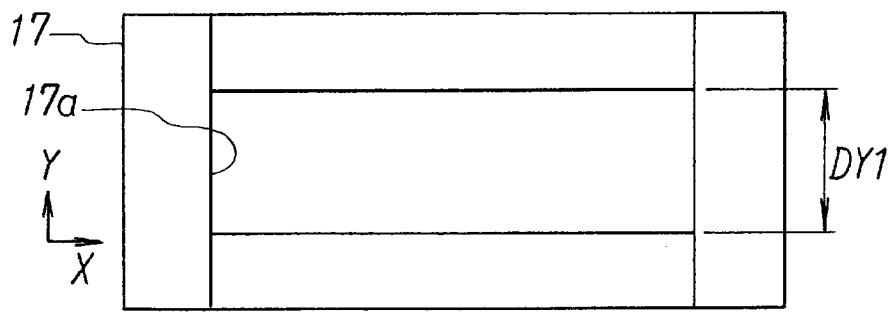
Figure 2C:
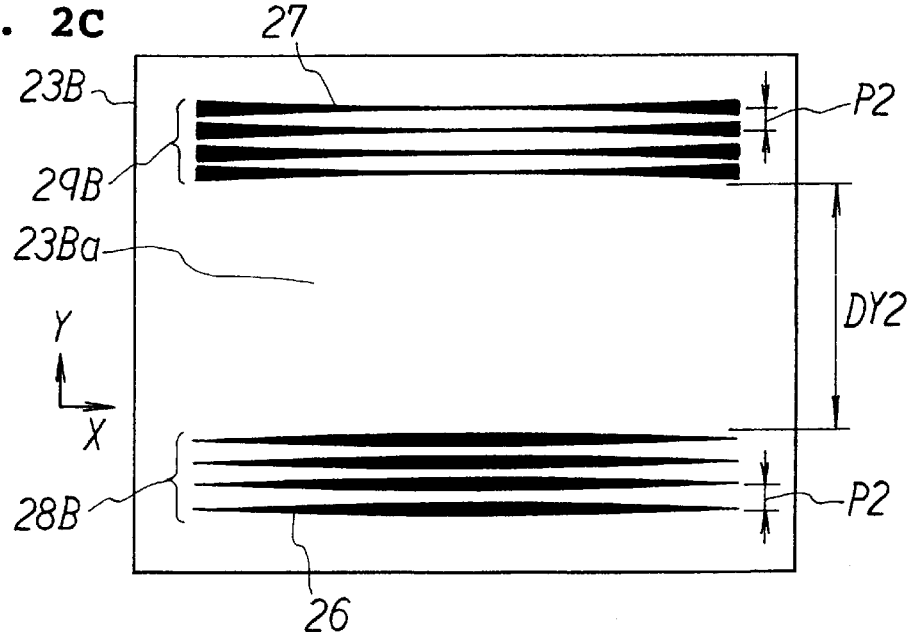

FIGS. 2A and 2C show plan views illustrating shielding patterns of the uneven illuminance-correcting plates 23A, 23B shown in FIG. 1 respectively. FIG. 2B shows a plan view illustrating the fixed blind 17 shown in FIG. 1. FIG. 2 shows a state in which the fixed blind 17 is projected onto the installation plane of the movable blind 13, i.e., the conjugate plane with respect to the reticle plane. In FIG. 2, the directions, which correspond to the non-scanning direction (X direction) and the scanning direction (Y direction) on the reticle plane, are designated as the X direction and the Y direction respectively. In the following description, Ma represents the projection magnification from the installation plane of the movable blind 13 (conjugate plane with the reticle plane) to the reticle plane. For example, it is assumed that the projection magnification Ma is $^{3}/_{2}$-fold (magnification), the projection magnification β from the reticle plane to the wafer plane is ¼-fold, and the slit width D of the exposure area 35P on the wafer W is 8 mm. On this assumption, the width DY1 in the Y direction of the slit-shaped opening 17a of the fixed blind 17 shown in FIG. 2B is represented as follows.

$$DY1 = 8 \cdot (1/\beta) \cdot (1/Ma) \quad (5)$$
$$= 8 \cdot 4 \cdot (2/3) \approx 21.3 \text{ (mm)}$$

As shown in FIG. 2A, groups of shielding lines 28A, 29A are formed on the pattern plane of the first uneven illuminance-correcting plate 23A to interpose a transmitting section 23Aa having a width DY2 (>DY1) in the Y direction. In the first shielding line group 28A, the plurality of shielding lines 26, in each of which the line width is gradually thickened toward the central portion from both ends in a manner of quadratic function for the position X in the non-scanning direction, are arranged approximately at a pitch P2 in the Y direction. For the purpose of simplification in FIG. 2 (and in the following drawings as well), the shielding line group 28A is composed of the four shielding lines 26. However, actually, the shielding line group 28A is composed of, for example, the shielding lines of about fifty individuals. More correctly, in order to avoid any occurrence of diffraction pattern by the exposure light beam IL, the plurality of shielding lines 26 are arranged in the Y direction at the pitch which gradually changes from the pitch P2 by about P2/10 to P2/100. As a result, the convex uneven illuminance of $e \cdot X^2$ (e>0) corresponding to the expression (4) can be corrected by projecting the image of one shielding line 26 onto the illumination area 35 of the reticle R shown in FIG. 1, because the transmittance at the central portion for the exposure light beam IL is decreased. The convex uneven illuminance of $n \cdot e \cdot X^2$ can be corrected by projecting the images of n individuals (n=1, 2, 3, ...) of the shielding lines 26. The value of the coefficient e depends on the shape of the shielding line 26. The value is previously stored in the storage unit in the main control system 22. Accordingly, the shielding line 26 can be referred to as "secondary shielding line for correcting the convex uneven illuminance".

On the other hand, in the second shielding line group 29A shown in FIG. 2A, the plurality of (four in FIG. 2, but actually about fifty) shielding lines 27, in each of which the line width is gradually thickened toward both ends from the central portion for the position X in a manner of quadratic function, are arranged in the Y direction at the pitch which gradually changes from the pitch P2 by about P2/10 to P2/100. As a result, the concave uneven illuminance of $-e \cdot X^2$ can be corrected by projecting an image of one shielding line 27 onto the illumination area 35 shown in FIG. 1, because the transmittance at the central portion for the exposure light beam IL is increased. The concave uneven illuminance of $-n \cdot e \cdot X^2$ can be corrected by projecting the images of n individuals of the shielding lines 27. Accordingly, the shielding line 27 can be referred to as "secondary shielding line for correcting the concave uneven illuminance". Each of the shielding lines 26, 27 can be formed, for example, by depositing (vapor-depositing) a shield film composed of chromium or the like onto a substrate which transmits the exposure light beam. In place of the shield film, a semitransparent film, which transmits the exposure light beam at a predetermined transmittance, may be used.

Further, in this embodiment, the pulse light beam is radiated. Therefore, assuming that $d_w$ represents the distance of movement of the wafer W during one cycle $T_{IL}$ of the pulse light emission, the distance $d_w \cdot (1/\beta) \cdot (1/Ma)$, which is obtained by converting the distance $d_w$ into the distance on the conjugate plane with respect to the reticle plane described above, is set to be different from the pitch P2, for example, by not less than 10%. Further, the distance $d_w \cdot (1/\beta) \cdot (1/Ma)$ is also set to be different from the pitch P2 by not less than about 10% based on the relationship of integral multiple with each other. Accordingly, the wafer W is prevented from transfer of defocused images of, for example, single shielding lines 26, 27 in the shielding line groups 28A, 29A.

As shown in FIG. 2C, a shielding line group 29B for correcting the concave uneven illuminance and a shielding line group 28B for correcting the convex uneven illuminance are formed on the pattern plane of the second uneven illuminance-correcting plate 23B to interpose a transmitting section 23Ba having a width DY2 in the Y direction. The shielding line groups 28B, 29B have the same shapes as those of the shielding line groups 28A, 29A of the first uneven illuminance-correcting plate 23A respectively. The shielding patterns of the uneven illuminance-correcting plates 23A, 23B have the (axisymmetric) shapes inverted in relation to the axis parallel to the X axis with each other. The convex or concave uneven illuminance can be corrected by using only the first uneven illuminance-correcting plate 23A as described above. However, when the two mutually inverted uneven illuminance-correcting plates 23A, 23B are used, then it is possible to suppress the occurrence of telecentric discrepancy in the scanning direction, and it is possible to correct the uneven inclination (coefficient c in the expression (4)) (as described in detail later on).

As described above, the transmittance with respect to the exposure light beam IL can be corrected in a transmissive manner by projecting the images of the shielding lines 26, 27 onto the illumination area 35. However, if the images of the shielding lines 26, 27 are excessively vivid, it is feared to generate a portion in which the condition that the exposure is performed with the number N of exposure pulses represented by the expression (1) on the wafer W is not satisfied, even in consideration of the integration effect obtained by the scanning exposure. In order to avoid such an inconvenience, the shielding patterns of the uneven illuminance-correcting plates 23A, 23B shown in FIG. 1 are formed on the mutually opposing surfaces, and the formation plane of each of the shielding patterns is installed at the position which is greatly defocused with respect to the conjugate plane with the reticle plane as compared with the fixed blind 17. Further, the shielding lines 26, 27 are formed as patterns to be as fine as possible. For example, each of the shielding lines 26, 27 has the shape which is capable of correcting the convex and concave uneven illuminance in the non-scanning direction of a degree of about ±0.05% (0.1% in width) with respect to the average value. Each of the shielding line groups 28A, 28B, 29A, 29B is composed of about fifty individuals of the shielding lines 26, 27. Therefore, as a whole, the convex and concave uneven illuminance in the non-scanning direction up to about 0 to 10% in width can be corrected with a resolution of about 0.1% in width.

It is assumed that $\delta Z1$ represents the defocus amount of the formation plane of the shielding line of the uneven illuminance-correcting plate 23A, 23B with respect to the conjugate plane with the reticle plane, $NA_{IL}$ represents the numerical aperture for the exposure light beam on the uneven illuminance-correcting plate 23A, 23B, and FD1 represents the line width in the scanning direction at the thickest portion of the shielding line 26, 27. On this assumption, it is desirable that the defocus amount $\delta Z1$ is set to satisfy the following expression.

$$\delta Z1 > FD1/(2 \cdot NA_{IL}) \qquad (6)$$

When a large number of minute dot patterns are used in place of the shielding line 26, 27 as described later on, the width in the scanning direction of the largest dot pattern of the dot patterns may be used in place of the line width FD1. When the condition of the expression (6) is satisfied, the shadow from the both ends of each of the shielding lines 26, 27, i.e., the point at which the light is completely shielded disappears in the illumination area 35 of the reticle R. The uneven illuminance in the stationary state is also decreased. Therefore, the unevenness of the totalized exposure amount during the scanning exposure is further reduced. As described above, the uneven illuminance-correcting plates 23A, 23B of this embodiment make it possible to increase the defocus amount $\delta Z1$. Therefore, the uneven illuminance-correcting plate 23A, 23B may be arranged at a defocused position on the light-outgoing side of the movable blind 13.

Specifically, with reference to FIG. 2A, the width of the convex shielding line 26 at the both ends is zero, and the width at the central portion is about 20 μm. Similarly, the width of the concave shielding line 27 at the central portion is zero, and the width at the both ends is about 20 μm. Further, the pitch P2 is about 200 μm, and the discrepancy amount of the pitch P2 is about 5 μm. The defocus amount $\delta Z1$ of the uneven illuminance-correcting plate 23A, 23B with respect to the conjugate plane conjugate with the reticle plane is, for example, about 30 mm. The defocus amount of the fixed blind 17 is set to be about ⅒ thereof.

Figure 3A:
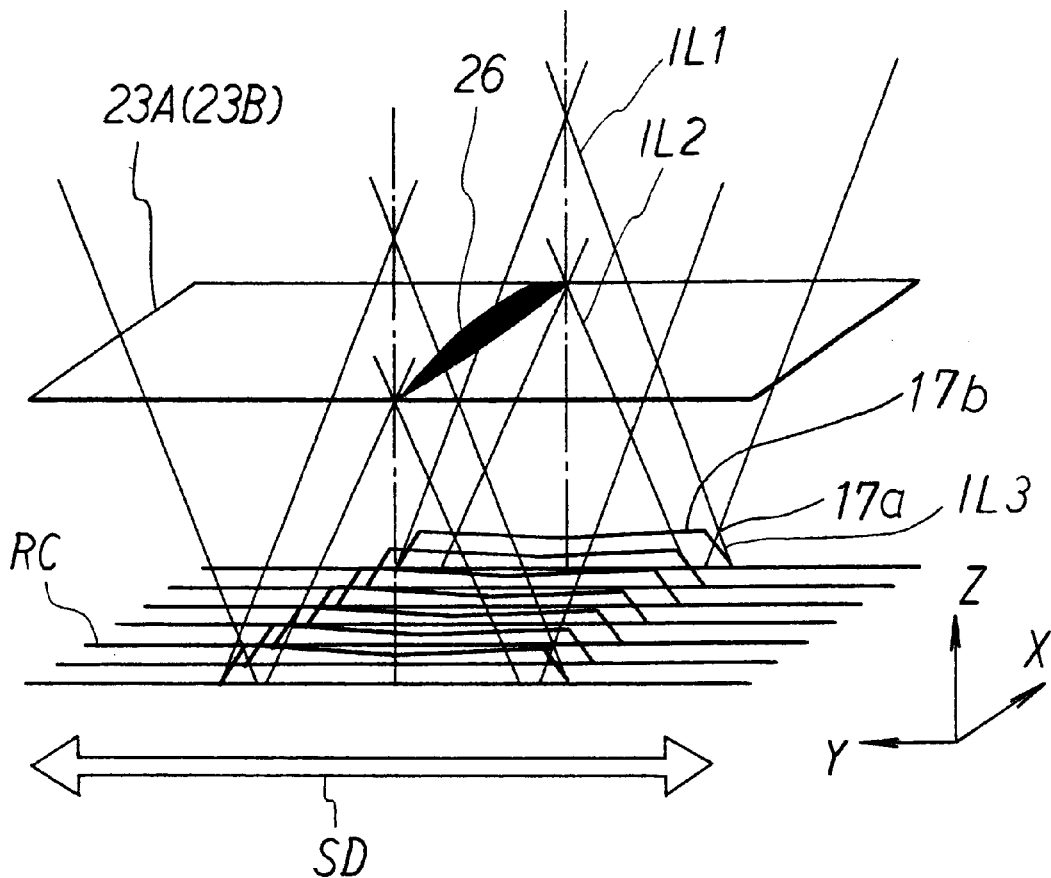
FIG. 3A shows a defocus state of the uneven illuminance-correcting plates 23A, 23B and the fixed blind 17 shown in FIG. 1.

FIG. 3A conceptually shows a state of defocus of the uneven illuminance-correcting plate 23A (23B as well) and the fixed blind 17. With reference to FIG. 3A, the fixed blind 17 (strictly speaking the conjugate image thereof) is slightly defocused in the optical axis direction (Z direction) with respect to the conjugate plane RC conjugate with the reticle plane. The uneven illuminance-correcting plate 23A is greatly defocused. As a result, the exposure light beam IL3, which has passed through the edge portion 17a (strictly speaking a conjugate image of the edge portion 17a) on the fixed blind 17, is slightly widened on the conjugate plane RC (and the wafer plane). Therefore, the illuminance distribution of the exposure area 35P shown in FIG. 1 has a trapezoidal shape in the scanning direction SD. In FIG. 3A, the illuminance distribution on the conjugate plane RC of the exposure light beam IL3 passed through the fixed blind 17 is conceptually depicted by a shape 17b which is approximated to a trapezoid. With reference to FIG. 3A, the exposure light beam IL2, which has passed through the edge portion of the shielding line 26 on the uneven illuminance-correcting plate 23A, is widened in a circular area having a diameter which is approximately in a degree of ½-fold to 1-fold of the width in the scanning direction of the opening of the fixed blind 17 on the conjugate plane RC. Therefore, the shielding line 26 is projected onto the conjugate plane RC and consequently the exposure area 35P on the wafer W in a state of being greatly defocused.

Figure 3B:
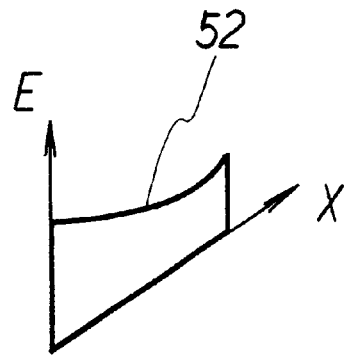
FIG. 3B shows an exemplary totalized exposure amount distribution.

When the scanning exposure is performed in this state, as shown in FIG. 3B, the totalized exposure amount E, which is obtained by approximately integrating the illuminance of the illumination area on the conjugate plane RC shown in FIG. 3A in the scanning direction SD, is obtained at each point on the wafer. Assuming that an approximately flat totalized exposure amount distribution is obtained for the position X in a state in which no shielding line 26 is provided, the totalized exposure amount E provides an approximately concave distribution in relation to the position X as indicated by a curve 52 by arranging the shielding line 26. This means the fact that the distribution of the totalized exposure amount in the non-scanning direction on the wafer can controlled by performing the projection while defocusing the shielding line 26. The reason of this fact will be described later on. The exposure light beam IL1, which comes from a point defocused to a greater extent as compared with the uneven illuminance-correcting plate 23A shown in FIG. 3A, represents the exposure light beam from the rough uneven illuminance-correcting plate 24 shown in FIG. 1.

Next, explanation will be made with reference to FIG. 5 for the arrangement of the shielding pattern of the rough uneven illuminance-correcting plate 24 included in the uneven illuminance-correcting mechanism.

Figure 5:
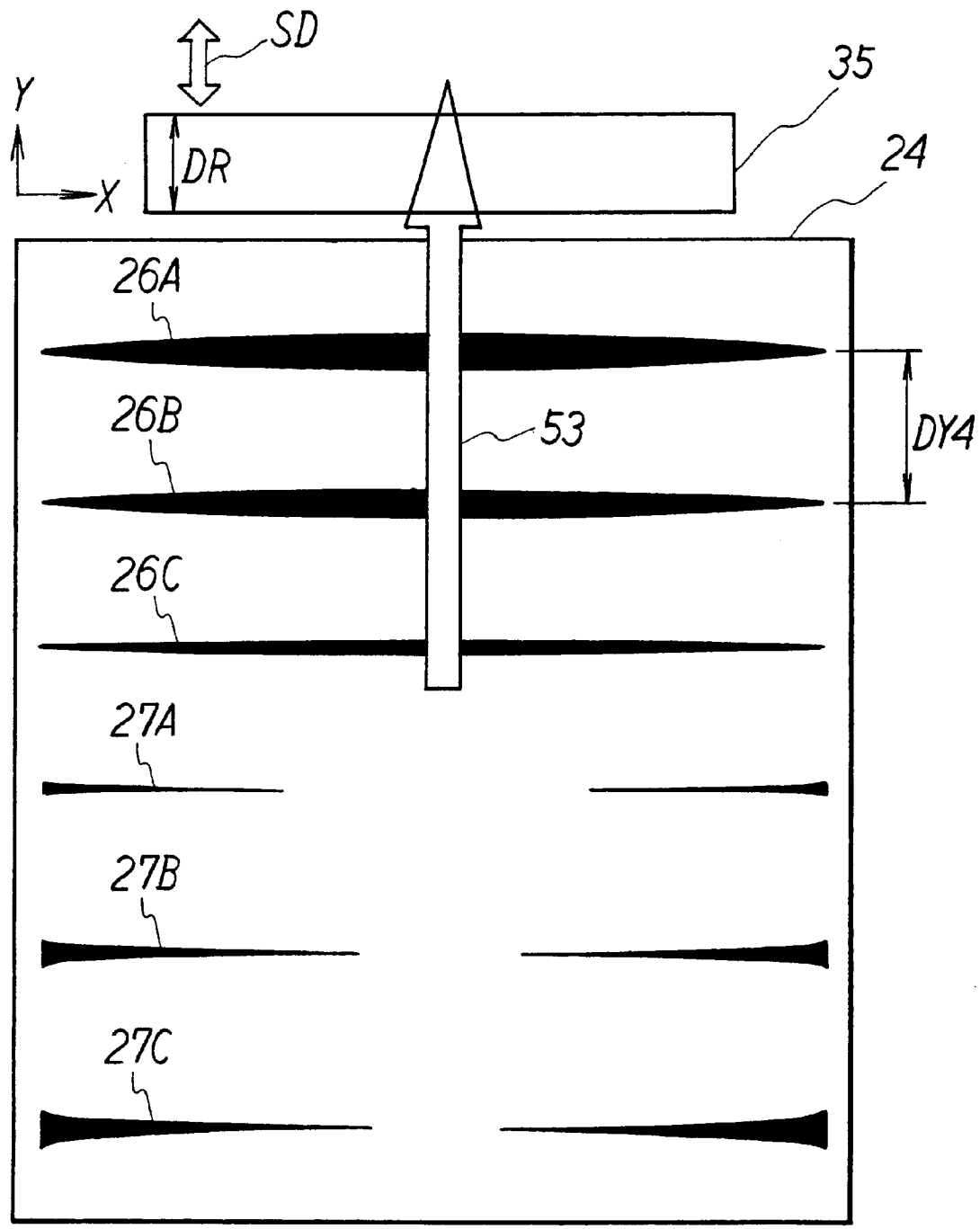
FIG. 5 shows a rough uneven illuminance-correcting plate 24 shown in FIG. 1.

FIG. 5 shows a state in which the rough uneven illuminance-correcting plate 24 is projected onto the reticle plane shown in FIG. 1. With reference to FIG. 5, convex shielding lines 26A, 26B, 26C having central portions with gradually thinning widths, and concave shielding lines 27C, 27B, 27A having both end portions with gradually widening widths are formed on the rough uneven illuminance-correcting plate 24 at a pitch DY4 with respect to the scanning direction SD (Y direction). The pitch DY4 is set to be wider than the width DR of the illumination area 35 in the scanning direction. The driving mechanism 20 shown in FIG. 1 is constructed to be capable of selecting a state in which no image of any one of the shielding lines 26A to 26C, 27A to 27C is projected in the illumination area 35, and a state in which a defocused image of arbitrary one of the shielding lines 26A to 26C, 27A to 27C is projected, by driving the rough uneven illuminance-correcting plate 24 in the Y direction.

In this embodiment, each of the thinnest shielding lines 26C, 27C resides in a shielding pattern composed of a quadratic curve having an effect of correcting the uneven illuminance corresponding to about 100 individuals of the shielding lines 26, 27 shown in FIG. 2. Each of the shielding lines 26B, 27B and each of the shielding lines 26A, 27A reside in shielding patterns composed of quadratic curves having effects of correcting the uneven illuminance in degrees of about 2-fold and about 3-fold of the shielding lines 26C, 27C respectively. Therefore, when the shielding lines 26A, 26B, 26C are selected by the driving mechanism 20, it is possible to correct the convex uneven illuminance in a degree of about 30%, the convex uneven illuminance in a degree of about 20%, and the convex uneven illuminance in a degree of about 10% in width in the non-scanning direction respectively. When the shielding lines 27A, 27B, 27c are selected by the driving mechanism 20, it is possible to correct the concave uneven illuminance in a degree of about 30%, the concave uneven illuminance in a degree of about 20%, and the concave uneven illuminance in a degree of about 10% in width in the non-scanning direction respectively. The maximum line width of each of the shielding lines 26A to 27C is fairly wide as compared with the shielding lines 26, 27 shown in FIG. 2. Therefore, the defocus amount of the rough uneven illuminance-correcting plate 24 is set to be about 1.5 to 2 times those of the uneven illuminance-correcting plates 23A, 23B so that the condition to perform the exposure with the integral number of pulses represented by the expression (1) is satisfied on the entire surface of the wafer.

The great degree of correction of the uneven illuminance as described above can be also realized by increasing the numbers of the shielding lines 26, 27 of the uneven illuminance-correcting plates 23A, 23B shown in FIG. 2 to about 200 to 300 individuals respectively. However, in such a case, the number of defocused images of the shielding lines 26, 27 in the exposure area 35P on the wafer is excessively large. It is feared that the condition to perform the exposure with the integral number of pulses in the expression (1) is not partially satisfied. In other words, when the rough uneven illuminance-correcting plate 24 of this embodiment is used, the convex or concave uneven illuminance in the non-scanning direction can be roughly corrected in a unit of about 10%, while satisfying the condition to perform the exposure with the integral number of pulses.

When it is known that the uneven illuminance in the non-scanning direction is smaller than about 10% in width depending on, for example, the condition of the use of the projection exposure apparatus, it is possible to omit the rough uneven illuminance-correcting plate 24.

Next, explanation will be made with reference to FIG. 6 for an illustrative arrangement of a driving mechanism for the uneven illuminance-correcting plates 23A, 23B, of the driving mechanism 20 shown in FIG. 1.

Figure 6A:
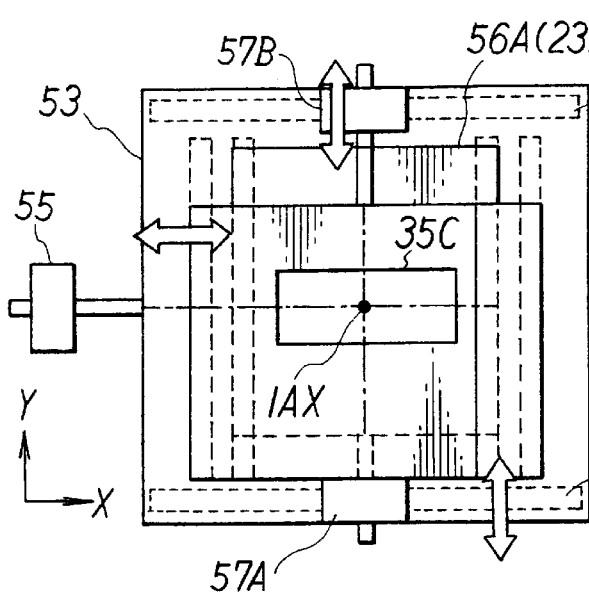
FIGS. 6A to 6E show an exemplary arrangement of a part of a driving mechanism 20 shown in FIG. 1.
Figure 6C:
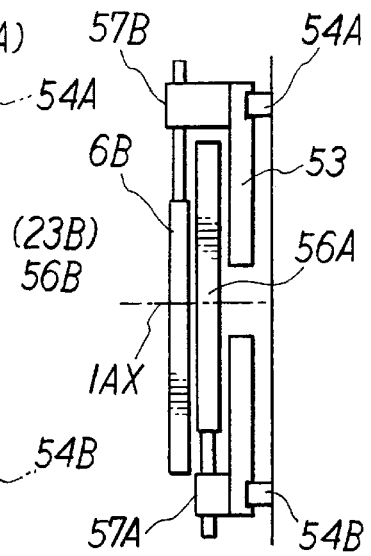
Figure 6B:
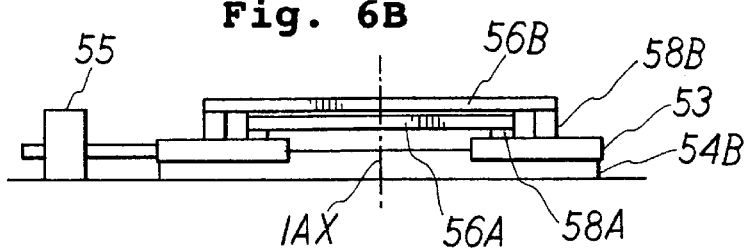

FIG. 6A shows a plan view illustrating the driving mechanism for the uneven illuminance-correcting plates 23A, 23B, FIG. 6B shows a front view thereof, and FIG. 6C shows a side view thereof. In FIGS. 6A to 6C, the directions, which correspond the non-scanning direction (X direction) and the scanning direction (Y direction) shown in FIG. 1, are designated as the X direction and the Y direction respectively. The area, which is conjugate with the illumination area 35 for the reticle R shown in FIG. 1, is represented by an illumination area 35C. In FIGS. 6A to 6C, a pair of guide members 54A, 54B are fixed to an unillustrated support member in parallel to the X direction. A frame-shaped X axis slider 53, which has an opening formed at a central portion for allowing the exposure light beam to pass therethrough, is arranged slidably in the X direction along the guide members 54A, 54B. The X axis slider 53 is driven in the X direction, for example, by a driving motor 55 based on a feed screw system.

Figure 6D:
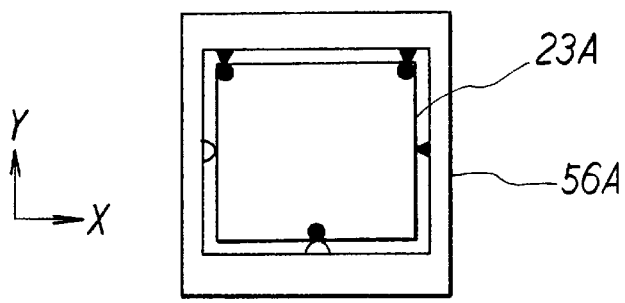
Figure 6E:
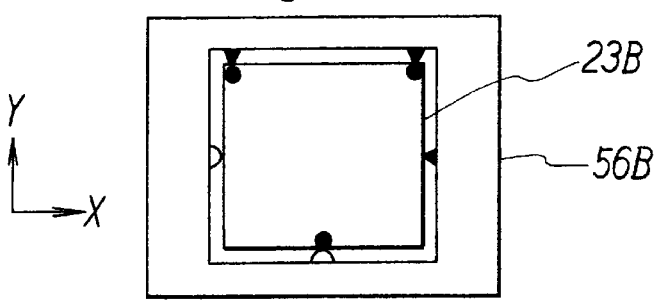

A frame-shaped first Y axis slider 56A is arranged on the X axis slider 53 by the aid of a pair of guide members 58A arranged in parallel to the Y axis. As shown in FIG. 6D, the first uneven illuminance-correcting plate 23A is held in a central opening of the Y axis slider 56A. The Y axis slider 56A is driven in the Y direction by a driving motor 57A based on a feed screw system fixed on the X axis slider 53. Further, a frame-shaped second Y axis slider 56B is arranged on the X axis slider 53 by the aid of a pair of guide members 58B arranged in parallel to the Y axis so that the Y axis slider 56A is covered therewith. As shown in FIG. 6E, the second uneven illuminance-correcting plate 23B is held in a central opening of the Y axis slider 56B. The Y axis slider 56B is driven in the Y direction by a driving motor 57B based on a feed screw system fixed to the X axis slider 53.

In this arrangement, although not shown, linear encoders for the X axis and the Y axis, each of which is based on, for example, the optical system, the electrostatic capacity system, or the magnetic system having a resolution of about 1 μm, are installed for the X axis slider 53 and the Y axis sliders 56A, 56B respectively. The X axis driving motor 55 and the Y axis driving motors 57A, 57B are driven by using, in a feedback manner, the measured values of the corresponding linear motors for the X axis and Y axis respectively. Accordingly, the uneven illuminance-correcting plates 23A, 23B can be positioned in the scanning direction (Y direction) independently from each other with respect to the illumination area 35C. Further, the uneven illuminance-correcting plates 23A, 23B can be positioned in an integrated manner in the non-scanning direction (X direction) with respect to the illumination area 35C. As described above, in this embodiment, the uneven illuminance-correcting plates 23A, 23B are integrally driven in relation to the non-scanning direction. However, for example, in order to correct the uneven inclination included in the uneven illuminance, it is desirable to make the arrangement so that the uneven illuminance-correcting plates 23A, 23B may be driven independently from each other in relation to the non-scanning direction as well.

Next, explanation will be made with reference to FIGS. 7 to 9 for an example of the operation for correcting the uneven illuminance by using the uneven illuminance-correcting mechanism of this embodiment. In the following description, the uneven illuminance-correcting plates 23A, 23B and the fixed blind 17 are illustrated in a state of being projected onto the conjugate plane (arrangement plane of the movable blind 13) with respect to the reticle plane shown in FIG. 1. In this case, the uneven illuminance-correcting plates 23A, 23B and the fixed blind 17 are defocused from the conjugate plane by predetermined amounts respectively. Therefore, predetermined fuzziness appears on each of the projected images thereof. Accordingly, as shown in FIG. 7, in order to illustrate the defocused state of the projected images, circular defocused images are also depicted in a superimposed manner, which are radiated from the shielding lines of the uneven illuminance-correcting plates 23A, 23B (larger circle) and single points on the edge portion of the opening of the fixed blind 17 (smaller circle) and which are projected onto the conjugate plane.

Figure 4A:
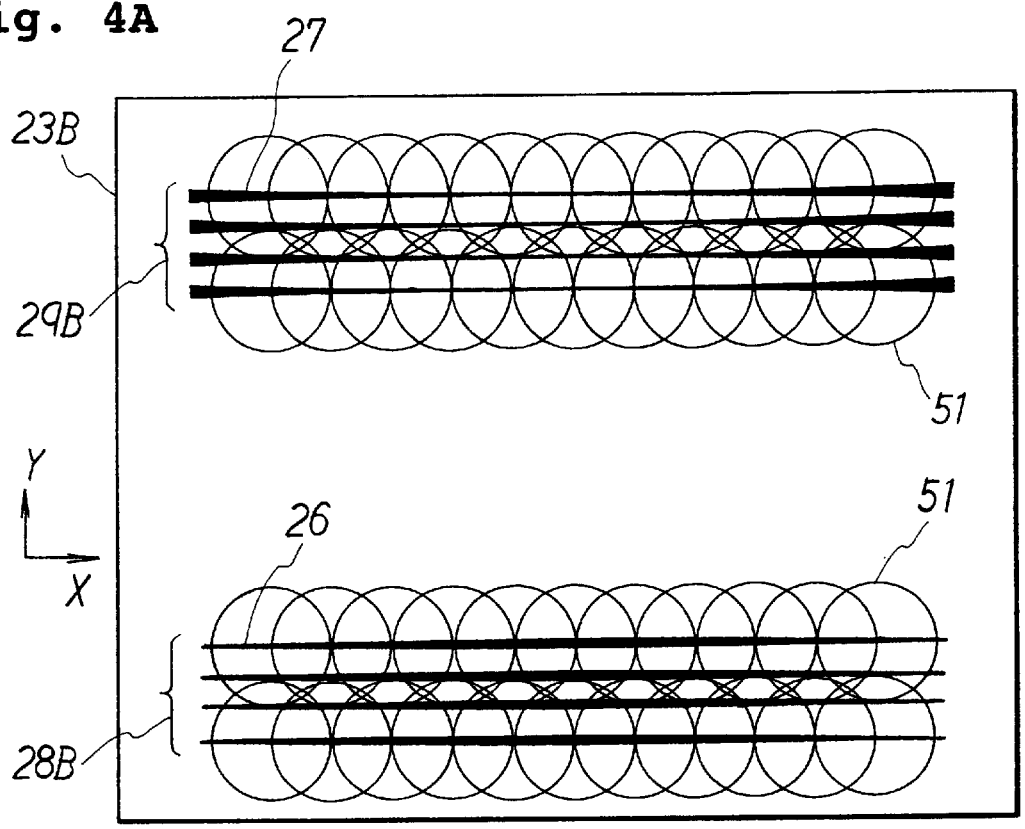
FIG. 4A shows a plan view illustrating the uneven illuminance-correcting plate 23B shown in FIG. 2.
Figure 4B:
FIG. 4B shows a view in which a shielding line 27 shown in FIG. 4A is magnified in the widthwise direction.
Figure 4C:
FIG. 4C shows a view in which a shielding line 26 shown in FIG. 4A is magnified in the widthwise direction.

FIG. 4A shows a plan view illustrating the second uneven illuminance-correcting plate 23B. FIG. 4B shows a view in which the concave shielding line 27 shown in FIG. 4A is magnified in the Y direction. FIG. 4C shows a view in which the convex shielding line 26 shown in FIG. 4A is magnified in the Y direction. In FIG. 4A, the circular areas represent defocused images 51 which are formed on the conjugate plane with respect to the reticle plane by the exposure light beam passing through an array of a large number of virtual points disposed along center lines of two shielding lines 26 located at both ends of the shielding line group 28B and an array of a large number of virtual points disposed along center lines of two shielding lines 27 located at both ends of the shielding line group 29B respectively. This means the fact that the images of the shielding lines 26, 27 are projected onto the wafer in a defocused state in a form in which their original shapes scarcely remain.

Figure 7A:
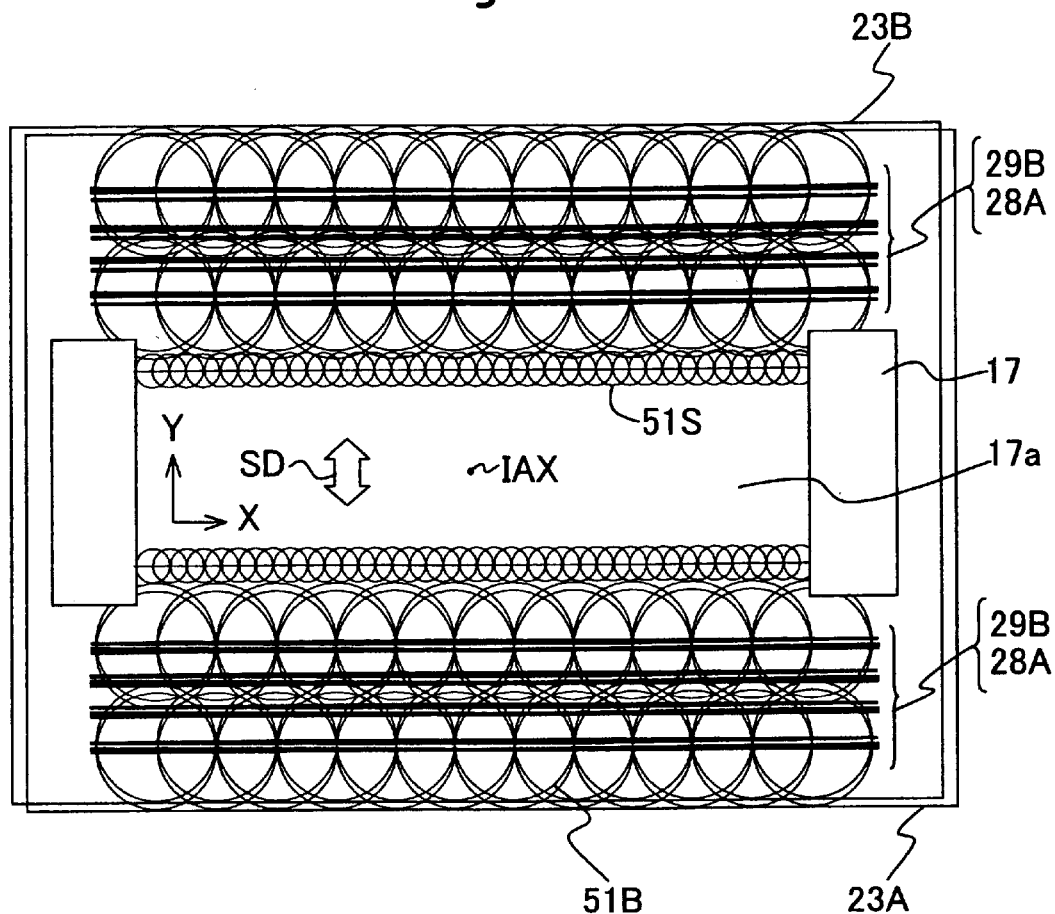
FIG. 7A shows a state in which the uneven illuminance-correcting plates 23A, 23B shown in FIG. 2 are positioned so that a group of shielding lines are not projected with respect to an opening 17a of the fixed blind 17.

At first, FIG. 7A shows a state in which the uneven illuminance-correcting plates 23A, 23B are moved to the outside in the scanning direction SD so that the defocused images 51B (images of virtual points disposed along a center line of the shielding line group in this case as well) of the respective shielding line groups 28A, 28B, 29A, 29B of the pair of uneven illuminance-correcting plates 23A, 23B do not enter the defocused image 51S of edge portions in the X direction of the opening 17a of the fixed blind 17, i.e., a state in which the uneven illuminance is not corrected at all by using the uneven illuminance-correcting plates 23A, 23B in the illumination area 35 shown in FIG. 1. In this case, it is assumed that the uneven illuminance is not corrected by using the rough uneven illuminance-correcting plate 24 as well.

As having been explained with reference to FIG. 15A, the illuminance-measuring section 42 shown in FIG. 1 is used in this state to measure the illuminance distribution E(X) in the non-scanning direction (X direction) in the exposure area 35P of the image plane of the projection optical system PL, i.e., the totalized exposure amount distribution in the non-scanning direction on the wafer W.

Figure 7B:
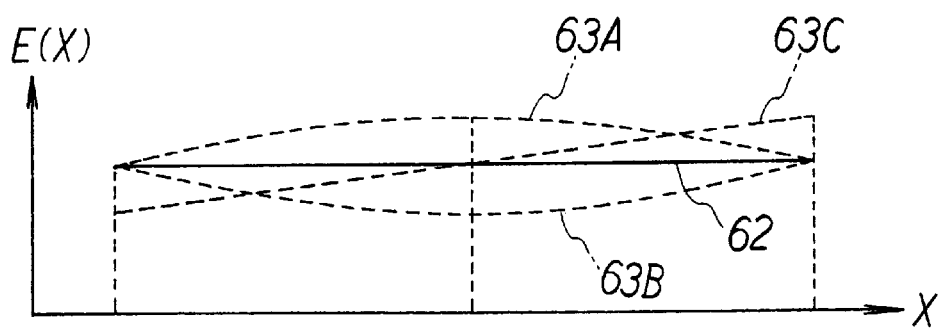
FIG. 7B shows an example of the uneven illuminance on a wafer corresponding to FIG. 7A.

FIG. 7B shows several examples of the result of the measurement of the illuminance distribution E(X). In FIG. 7B, the horizontal axis indicates the position in the X direction in the exposure area 35P, and the vertical axis indicates the value E(X) of the illuminance integrated in the scanning direction at the respective positions X. This assumption also holds in FIG. 8B and FIG. 9B described later on. With reference to FIG. 7B, when the measurement result of the illuminance distribution E(X) is flat as indicated by a solid straight line 62, it is unnecessary to perform the correction for the uneven illuminance by using the uneven illuminance-correcting plates 23A, 23B and the rough uneven illuminance-correcting plate 24. On the other hand, when the measurement result of the illuminance distribution E(X) in the non-scanning direction indicates the convex uneven illuminance depicted by a curve 63A of dotted line, the concave uneven illuminance depicted by a curve 63B of dotted line, the uneven inclination depicted by an inclined straight line 63C of dotted line, or other types of the uneven illuminance, and the uneven illuminance exceeds about ±0.1% (0.2% in width) with respect to the average value, then the uneven illuminance is corrected under the control of the main control system 22 shown in FIG. 1.

When the uneven illuminance is, for example, not less than about 10% in width, the rough uneven illuminance-correcting plate 24 is firstly positioned in the scanning direction SD as shown in FIG. 5 to project projection images of appropriate shielding lines of the shielding lines 26A to 27A onto the illumination area 35 so that the uneven illuminance in the non-scanning direction is included within about 10% in width. The remaining uneven illuminance is corrected by using the uneven illuminance-correcting plates 23A, 23B.

Figure 8A:
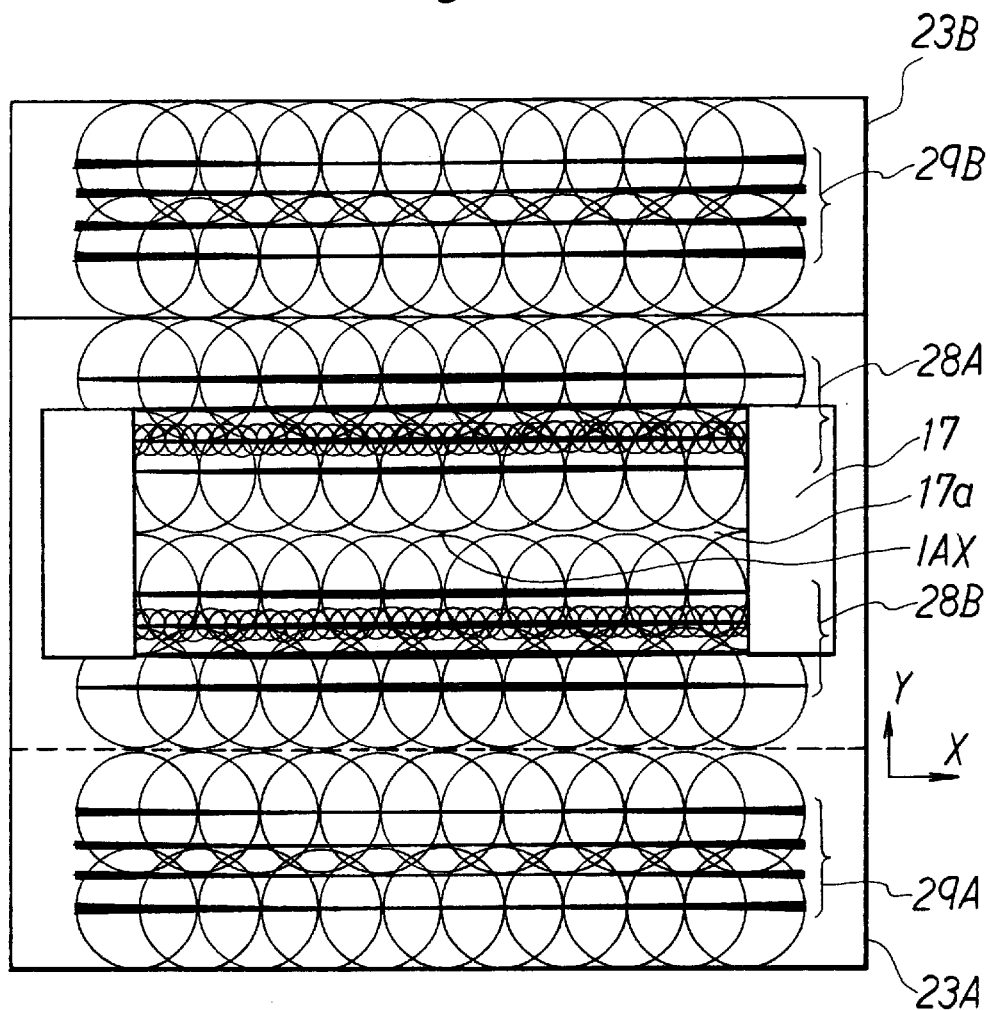
FIG. 8A shows a state in which the uneven illuminance-correcting plates 23A, 23B shown in FIG. 2 are driven in the scanning direction with respect to the opening 17a of the fixed blind 17.
Figure 8B:
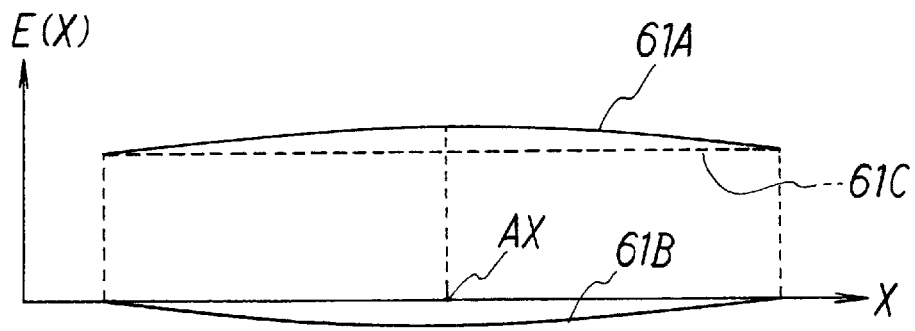
FIG. 8B shows an example of the uneven illuminance on the wafer corresponding to FIG. 8A.

Specifically, as indicated by a curve 61A of solid line shown in FIG. 8B, when the convex uneven illuminance remains in the illuminance distribution E(X), the uneven illuminance-correcting plates 23A, 23B are driven symmetrically in the Y direction with respect to the optical axis IAX of the illumination optical system as shown in FIG. 8A to symmetrically project defocused images of a part of the shielding line group 28A for correcting the convex uneven illuminance of the uneven illuminance-correcting plate 23A and a part of the shielding line group 28B for correcting the convex uneven illuminance of the uneven illuminance-correcting plate 23A onto the illumination area (projected image of the opening 17a). The driving amounts of the uneven illuminance-correcting plates 23A, 23B in this procedure are set so that the correction amount for the illuminance offsets the convex uneven illuminance as indicated by a curve 61B of solid line shown in FIG. 8B. As a result, the illuminance distribution E(X) in the non-scanning direction after the correction is flat as indicated by a curve 61C of dotted line. In this case, the relationship between the driving amounts of the uneven illuminance-correcting plates 23A, 23B and the amount of correction of the uneven illuminance is actually measured beforehand, and the relationship is stored in the storage unit of the main control system 22. The main control system 22 sets the driving amounts of the uneven illuminance-correcting plates 23A, 23B on the basis of the stored relationship. As understood from FIG. 8B, the average illuminance is lowered due to the correction of the uneven illuminance. Therefore, the correction is also made for the coefficient for calculating the illuminance on the wafer W from the measured value of the integrator sensor 19 shown in FIG. 1. As a result, the totalized exposure amount in the respective shot areas on the wafer W after the scanning exposure is approximately uniform, and it substantially coincides with the target value.

In this case, the defocused images of the shielding line groups 28A, 28B are projected symmetrically in the Y direction in the illumination area in this embodiment. Therefore, the telecentricity is not changed.

In order to further decrease the uneven illuminance, the illuminance distribution E(X) of the exposure area 35P may be actually measured by using the illuminance-measuring section 42 shown in FIG. 1 after driving the uneven illuminance-correcting plates 23A, 23B to finely adjust the positions of the uneven illuminance-correcting plates 23A, 23B so that any residual value is offset if any uneven illuminance remains in the actually measured value. Further, it is desirable that the average illuminance of the exposure area 35P is measured again by using an unillustrated radiation amount monitor on the wafer stage 29 after the correction operation to update the coefficient for calculating the illuminance on the wafer from the measured value of the integrator sensor 19. Accordingly, it is possible to improve the uniformity of the totalized exposure amount and the accuracy with respect to the target value.

When the concave uneven illuminance is measured in place of the curve 61A shown in FIG. 8B, the following procedure may be adopted. That is, with reference to FIG. 8B, the uneven illuminance-correcting plates 23A, 23B are further driven symmetrically in the Y direction in order to correct the concave uneven illuminance. Accordingly, the images of the shielding line groups 29A, 29B for correcting the concave uneven illuminance are projected onto the inside of the illumination area (projected image of the opening 17a).

For example, when the collapse amount in the Y direction is measured for the telecentricity measured by using the spatial image-measuring system 46 shown in FIG. 1, the driving amounts in the Y direction of the uneven illuminance-correcting plates 23A, 23B (shielding line groups 28A, 28B) as shown in FIG. 8A may be allowed to differ so that the telecentric discrepancy amount is offset. Accordingly, the uneven illuminance and the telecentric discrepancy can be corrected simultaneously.

Figure 9A:
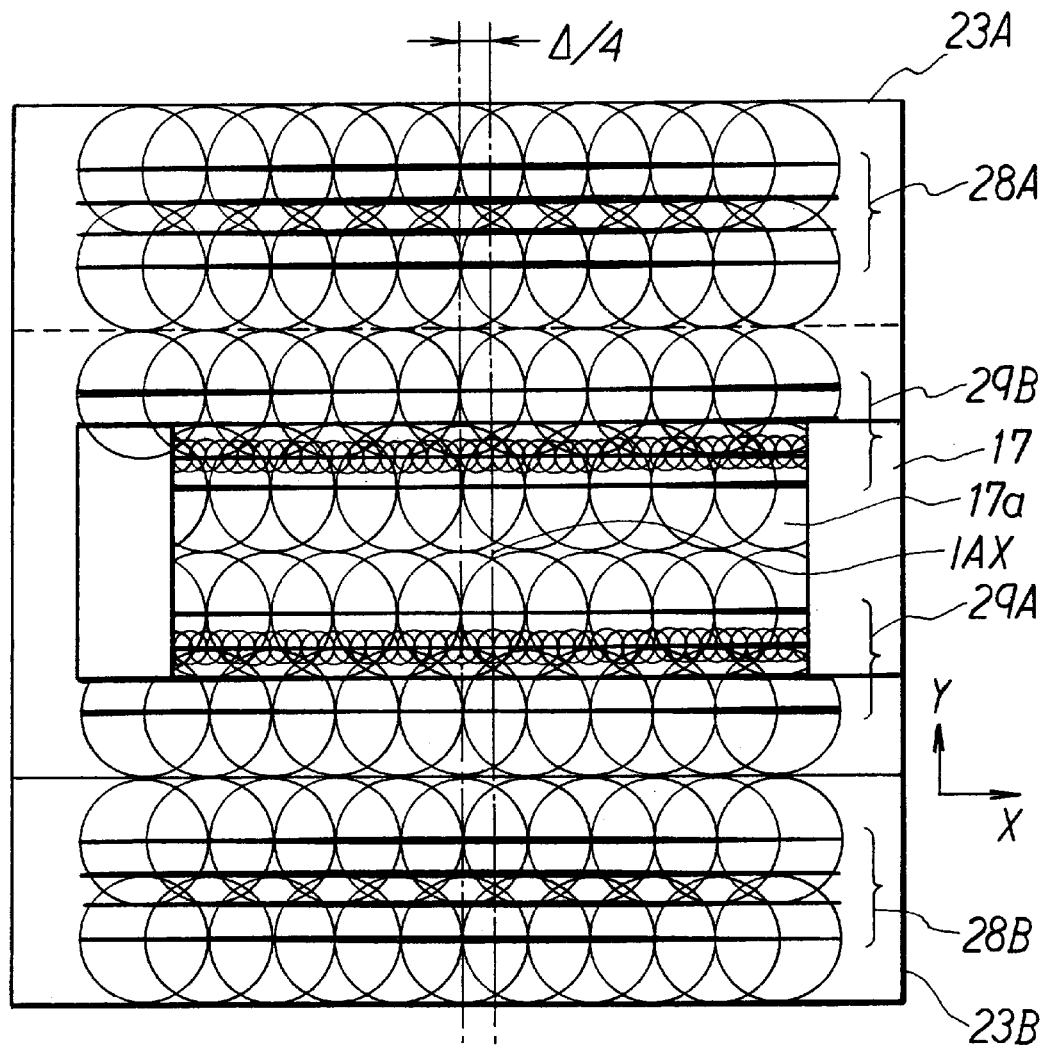
FIG. 9A shows a state in which the uneven illuminance-correcting plates 23A, 23B shown in FIG. 2 are driven in the scanning direction and the non-scanning direction with respect to the opening 17a of the fixed blind 17.
Figure 9B:
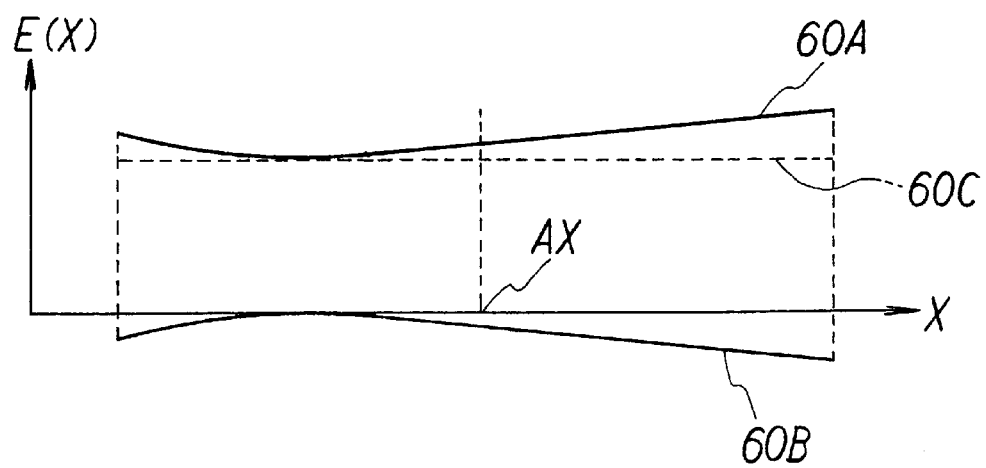
FIG. 9B shows an example of the uneven illuminance on the wafer corresponding to FIG. 9A.

On the other hand, when the concave uneven illuminance, which has the center at the position shifted in the X direction from the optical axis AX of the projection optical system PL, remains in the illuminance distribution E(X) as indicated by a curve 60A of solid line shown in FIG. 9B, the uneven illuminance-correcting plates 23A, 23B are driven in the Y direction as shown in FIG. 9A to project defocused images of parts of the shielding line groups 29A, 29B for correcting the concave uneven illuminance onto the inside of the illumination area. Further, the uneven illuminance-correcting plates 23A, 23B are integrally driven in the non-scanning direction (in the −X direction in FIG. 9) in the amount (designated as "Δ/4") corresponding to the shift amount of the concave uneven illuminance in the X direction. Accordingly, the correction amount for the illuminance brought about by the uneven illuminance-correcting plates 23A, 23B is set so that the shifted convex uneven illuminance is offset as indicated by a curve 60B of solid line shown in FIG. 9B. As a result, the illuminance distribution E(X) in the non-scanning direction after the correction is flat as indicated by a dotted straight line 60C. The totalized exposure amount on the wafer W after the scanning exposure is uniform, and it substantially coincides with the target value.

When the remaining uneven illuminance is the uneven inclination as indicated by the straight line 63C shown in FIG. 7B, for example, the first uneven illuminance-correcting plate 23A shown in FIG. 9A may be driven in the −Y direction and the +X direction to arrange the shielding line group 28A for correcting the convex uneven illuminance after being shifted by Δ/4 in the +X direction in place of the shielding line group 29A. During this process, the correction amount for the uneven inclination can be controlled by adjusting the driving amounts of the uneven illuminance-correcting plates 23A, 23B in the Y direction and the shift amount Δ/4 in the X direction.

Explanation will now be made for the relationship between the shapes of the shielding line groups 28A, 28B, 29A, 29B and the driving amount and the correction amount for the uneven illuminance. At first, as having been already explained, the projection magnification from the arrangement plane (conjugate plane with respect to the reticle plane) of the movable blind 13 to the reticle plane is Ma, and the projection magnification from the reticle R to the wafer W is β. Further, it is assumed that $NA_{PL}$ represents the numerical aperture of the exposure light beam on the wafer W, σ represents the coherence factor (σ value) of the exposure light beam on the reticle R, $\delta Z1$ represents the average value of the defocus amounts of the formation planes of the shielding lines on the uneven illuminance-correcting plates 23A, 23B, and FD1 represents the width of the shielding line in the scanning direction. On this assumption, the fuzziness width $\delta Y1$ of the image of the shielding line on the conjugate plane conjugate with the reticle plane is as follows.

$$\delta Y1 = 2 \cdot \delta Z1 \cdot NA_{PL} \cdot \sigma \cdot \beta \cdot Ma + FD1 \qquad (7)$$

When it is assumed that the magnification β is ¼-fold, the magnification Ma is ⅔-fold, the numerical aperture $NA_{PL}$ is 0.6 to 0.85, σ (coherence factor) is 0.3 to 0.9, the defocus amount $\delta Z1$ is 30 mm, and the line width FD1 is 0.02 mm, then the fuzziness width $\delta Y1$ of the image of the shielding line on the conjugate plane varies within the following range.

$$\text{about } 4.1 \text{ (mm)} < \delta Y1 < \text{about } 17.5 \text{ (mm)} \qquad (8)$$

Assuming that the width (slit width) of the exposure area 35P on the wafer W in the scanning direction is 8 mm, the slit width on the conjugate plane with respect to the reticle plane is about 21.3 mm according to the expression (5). Accordingly, the uneven illuminance Fx1 in the stationary state in the exposure area 35P is approximately calculated as follows by using the fuzziness width $\delta Y1$ in the expression (7) under the condition in which the fuzziness width is the smallest, i.e., under the condition in which the numerical aperture $NA_{PL}$ is 0.6 and $\sigma$ is 0.3.

$$Fx1 = \{FD1 \cdot \delta Y1 / (\pi \cdot \delta Y1^2)\} \times 100(\%) \quad (9)$$
$$= [0.02 \times 4.1 / \pi \cdot 4.1^2)] \times 100 = 0.6(\%)$$

Therefore, it is appreciated that the defocused projected images of the shielding line groups 28A, 29A scarcely affect the uneven illuminance. Further, the uneven illuminance Fx1 is actually reduced to a great extent owing to the integration effect brought about by the scanning exposure.

On the basis of the foregoing results, the relationship between the shape of the shielding line group 28A, 29A and the driving amount and the correction amount for the uneven illuminance in the non-scanning direction (dispersion of the totalized exposure amount in the non-scanning direction) is determined in accordance with the computer simulation. Obtained results are shown in Table 1. In this procedure, it is assumed that the defocus amount $\delta Z1$ is 30 mm. In Table 1, the number of lines indicates the number of the shielding lines 26, 27 in the shielding line group 28A, 29A, the line width (FD1) (mm) indicates the maximum width of the shielding line 26, 27, and the line interval indicates the pitch of the shielding lines 27, 27 in the scanning direction. However, as having been already explained, the line interval is set to be gradually narrowed by 0.005 mm in order to avoid any occurrence of interference light. The line interval shown in Table 1 represents, with an approximate value, the pitch of the shielding lines entered the illumination area just before. In Table 1, the shielding width (mm) represents a total value of the maximum widths of all of the shielding lines 26, 27 for shielding the exposure light beam, i.e., a product of the number of lines and the line width. The driving amount (mm) represents the symmetric movement amount in the Y direction of the uneven illuminance-correcting plate 23A, 23B shown in FIG. 7. The uneven illuminance correction amount (%) represents the width of the uneven illuminance correction amount with respect to the average value of the illuminance in the non-scanning direction.

TABLE 1

| Number of lines | Line width (mm) | Line interval (mm) | Shielding width (mm) | Driving amount (mm) | Uneven illuminance correction amount % |
|---|---|---|---|---|---|
| 2 | 0.02 | 0.200 | 0.04 | 0.20 | 0.19 |
| 4 | 0.02 | 0.199 | 0.08 | 0.40 | 0.38 |
| 6 | 0.02 | 0.198 | 0.12 | 0.60 | 0.56 |
| 8 | 0.02 | 0.197 | 0.16 | 0.79 | 0.75 |
| 10 | 0.02 | 0.196 | 0.20 | 0.99 | 0.94 |
| 20 | 0.02 | 0.191 | 0.40 | 1.96 | 1.88 |
| 30 | 0.02 | 0.186 | 0.60 | 2.90 | 2.81 |
| 40 | 0.02 | 0.181 | 0.80 | 3.81 | 3.75 |
| 50 | 0.02 | 0.176 | 1.00 | 4.70 | 4.69 |
| 60 | 0.02 | 0.171 | 1.20 | 5.57 | 5.63 |
| 70 | 0.02 | 0.166 | 1.40 | 6.41 | 6.56 |
| 80 | 0.02 | 0.161 | 1.60 | 7.22 | 7.50 |
| 90 | 0.02 | 0.156 | 1.80 | 8.01 | 8.44 |
| 100 | 0.02 | 0.151 | 2.00 | 8.78 | 9.38 |
| 110 | 0.02 | 0.146 | 2.20 | 9.52 | 10.31 |
| 120 | 0.02 | 0.141 | 2.40 | 10.23 | 11.25 |
| 130 | 0.02 | 0.136 | 2.60 | 10.92 | 12.19 |

Actually, the fuzziness portion of the projected image of the shielding line 26, 27 also enters the inclined section of the trapezoidal illuminance distribution of the exposure area (for example, the illuminance distribution F(Y) shown in FIG. 15C). Therefore, the maximum value of the correction amount of the uneven illuminance is decreased by about several %. However, the driving amount of the uneven illuminance-correcting plate 23A, 23B can be continuously controlled at an accuracy of about 0.01 mm. The uneven illuminance can be corrected approximately in proportion to the driving amount. Therefore, the uneven illuminance can be corrected at an accuracy of about 0.01%. When the number of lines is 130, then the number of the shielding lines 26, 27 in the shielding line group 28A, 29A is 65, and the width of the shielding line group 28A, 29A in the scanning direction is 10.8 mm.

According to the results described above, the size of the uneven illuminance-correcting plate 23A, 23B and the driving stroke in the scanning direction are determined as follows corresponding to the results shown in Table 1. It is assumed that the magnification $\beta$ is ¼-fold, the magnification Ma is ³⁄₂-fold, and the fuzziness width $\delta Y1$ of the image of the shielding line is the maximum value (17.5 mm) in the expression (8). Further, it is assumed that the margin for the size is 12 mm, the correction amount for the uneven inclination in the non-scanning direction (movement amount $\Delta/4$ in the X direction shown in FIG. 9) is 4 mm, and the margin for the driving amount in the scanning direction is 1.7 mm.

Width in Scanning Direction $$= 8 \times 4 / 1.5 + 10.8 \times 2 + 17.5 \times 2 + 12 \text{ (margin)} \quad (10)$$
$$= 90 \text{ (mm)}$$

Width in Non-scanning Direction $$= 25 \times 4 / 1.5 + 17.5 + 4 \text{ (inclination correction amount)} + \quad (11)$$
$$12 \text{ (margin)}$$
$$= 100 \text{ (mm)}$$

Driving Stroke in Scanning Direction $$= \pm (17.5 + 10.8 + 1.7 \text{ (margin)}) \quad (12)$$
$$= \pm 30 \text{ (mm)}$$

($\pm$ corresponds to amount of irregularity)

In the embodiment described above, for example, the uneven illuminance in the non-scanning direction is measured periodically by using the illuminance-measuring section 42 shown in FIG. 1. The uneven illuminance-correcting plates 23A, 23B and the rough uneven illuminance-correcting plate 24 are driven so that the obtained result of the measurement is corrected. Another operation may be performed as follows. For example, the relationship between the working time measured by using a timer and the amount of change of the uneven illuminance is measured beforehand with respect to another projection exposure apparatus of the identical type. The relationship may be stored as a table in the storage unit of the main control system 22 of the projection exposure apparatus of this embodiment. In this case, the state of the uneven illuminance is postulated by using the table depending on the working time. The uneven illuminance-correcting plates 23A, 23B and the rough uneven illuminance-correcting plate 24 are driven so that the postulated uneven illuminance is corrected. Accordingly, it is possible to omit the operation for measuring the illuminance distribution based on the use of the illuminance-measuring section 42. Thus, the throughput in the exposure step is improved.

Next, explanation will be made for various modified embodiments of the uneven illuminance-correcting plate 23A, 23B of the embodiment described above.

Figure 10:
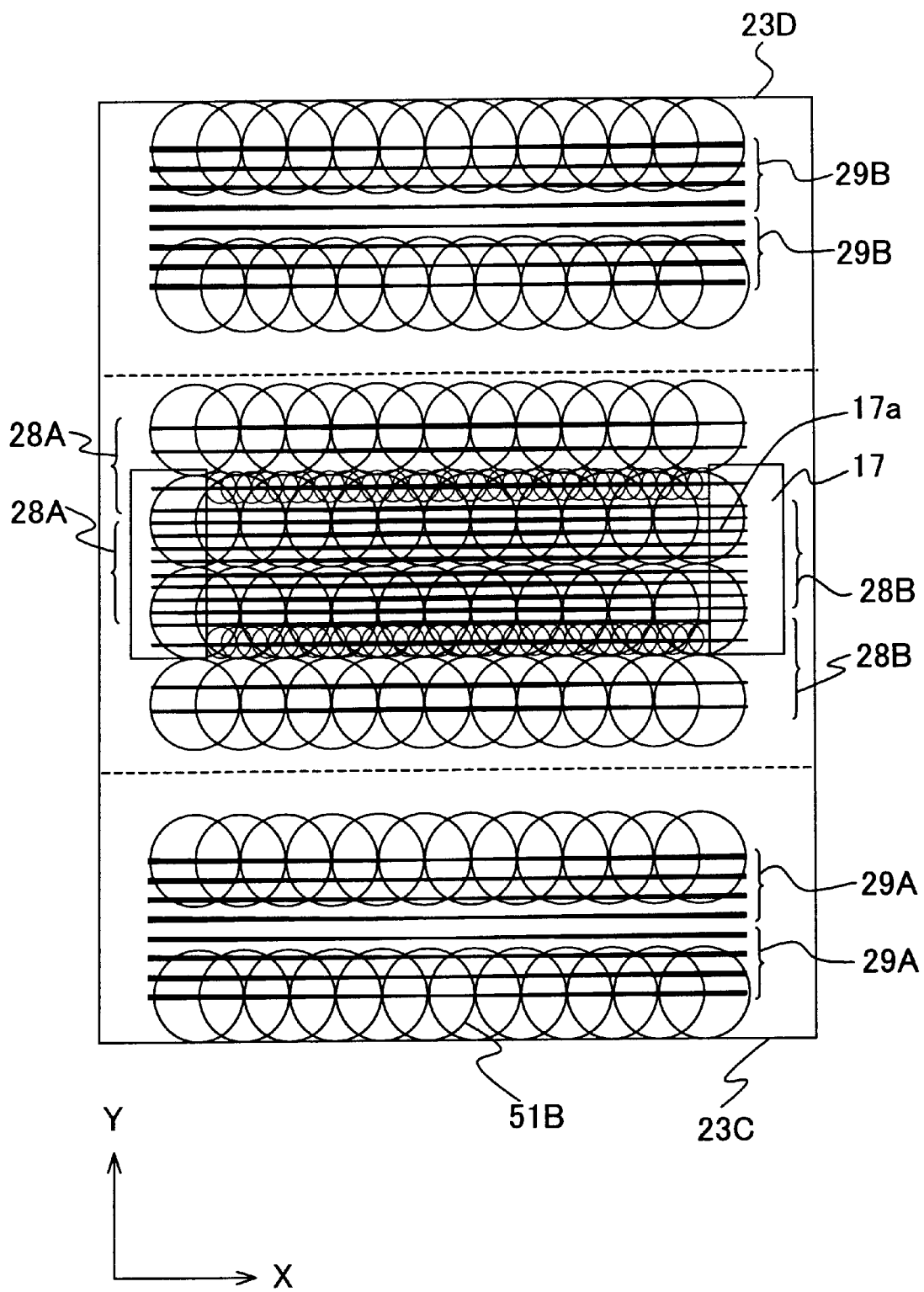
FIG. 10 shows a state in which uneven illuminance-correcting plates 23C, 23D according to a first modified embodiment are positioned with respect to the fixed blind 17.

FIG. 10 shows uneven illuminance-correcting plates 23C, 23D of a first modified embodiment as illustrated corresponding to the uneven illuminance-correcting plates 23A, 23B shown in FIG. 8A. With reference to FIG. 10, two pairs of convex uneven illuminance-correcting shielding line groups 28A and two pairs of concave uneven illuminance-correcting shielding line groups 29A are formed in parallel on the first uneven illuminance-correcting plate 23C. Two pairs of shielding line groups 28B and two pairs of shielding line groups 29B are formed in parallel on the second uneven illuminance-correcting plate 23D. That is, the shielding line groups are formed on each of the uneven illuminance-correcting plates 23C, 23D in an area which is twice as large as that of each of the uneven illuminance-correcting plates 23A, 23B shown in FIG. 8. In this arrangement, the entire area of the image of the opening 17a of the fixed blind 17 (illumination area 35) can be covered with the shielding line groups 28A, 29A (or 28B, 29B) of one sheet of the uneven illuminance-correcting plate 23C (or 23D).

In this modified embodiment, as shown in FIG. 10, for example, the uneven illuminance-correcting plates 23C, 23D are driven so that the shielding line group 28A of the uneven illuminance-correcting plate 23C and the shielding line group 28B of the uneven illuminance-correcting plate 23D are arranged alternately in the scanning direction in the image of the opening 17a. As a result, the shielding area can be twice as large as that of the case shown in FIG. 8. The convex uneven illuminance, the concave uneven illuminance, and the uneven inclination can be corrected with a wide range which is twice as large as that of the case shown in FIG. 8. However, in the example shown in FIG. 10, the driving amount in the scanning direction of each of the uneven illuminance-correcting plate 23C, 23D is about two-fold. Therefore, when it is intended to preferentially miniaturize the projection exposure apparatus, the illustrative arrangement shown in FIG. 8 may be used.

The correction range for the uneven illuminance may be widened by gradually narrowing the spacing distance between the shielding lines 26, 27 in the shielding line groups 28A, 29A, or by gradually thickening the maximum line width of the shielding lines 26, 27, in place of the procedure shown in FIG. 10 in which the area of the shielding line group 28A, 29A is widened.

The shielding line 26, 27 of this embodiment has the shape in which the line width is changed in a form of quadratic function in relation to the position in the non-scanning direction. However, the shielding line 26, 27 may have a shape in which the line width is change, for example, in a form of cubic function or higher order function or exponential function. Further, the shape of the shielding line 26, 27 may be determined so as to correct the dispersion of the illuminance distribution E(X) actually measured by using the illuminance-measuring section 42 as shown in FIGS. 15A, 15B. Another arrangement may be available, in which the uneven illuminance-correcting plate 23A, 23B may be exchanged with an uneven illuminance-correcting plate formed with special shielding lines to correct the uneven illuminance actually measured as described above, during the operation of the projection exposure apparatus of this embodiment. Accordingly, it is possible to respond to the occurrence of unexpected irregular uneven illuminance.

Especially, this technique is effective to correct the variation of the uneven illuminance in short period caused by the difference in transmittance of the reticle pattern in the non-scanning direction. When the operation is actually performed, the uneven illuminance-correcting plate may be exchanged or switched to be used depending on the variation characteristic inherent in each of the projection optical systems. Further, the following procedure may be available in place of the exchange of the uneven illuminance-correcting plate 23A, 23B. That is, a plurality of fixed blinds (fixed blinds having deformed openings) are prepared, each of which has an opening in which the width in the non-scanning direction is gradually changing with different characteristics in order to control the totalized exposure amount distribution. The fixed blind 17 may be exchanged with the fixed blinds described above. Alternatively, the irregular uneven illuminance may be corrected by inserting/withdrawing or exchanging a specialized uneven illuminance-correcting plate corresponding to the fixed blind having the deformed opening on the conjugate plane with respect to the reticle plane or a plane defocused from the conjugate plane.

In this arrangement, in order to principally correct the uneven illuminance in the non-scanning direction, the shielding line group 28A, 29A is composed of the shielding lines with which neither diffracted light nor scattered light is generated in the non-scanning direction. Therefore, it is feared that any uneven illuminance remains in the scanning direction when the static exposure is performed. Accordingly, when the method for correcting the uneven illuminance of the embodiment described above is adopted to a projection exposure apparatus (for example, a stepper) of the static exposure type (full field exposure type), an uneven illuminance-correcting plate, in which a large number of light-shielding dot patterns are formed in a density distribution independent in the X direction and the Y direction, may be used in place of the uneven illuminance-correcting plate 23A, 23B to control the density distribution of the large number of light-shielding dot patterns so that the uneven illuminance is offset over the entire surface of the exposure area. However, it is also feared that any speckle or the like occurs in the two directions depending on, for example, the size and the interval of the dot pattern. Therefore, it is necessary to make the design so that the speckle or the like is suppressed. It is needless to say that the uneven illuminance-correcting plate, in which the large number of light-shielding dot patterns are formed in the density distribution independent in the X direction and the Y direction, is also applicable to the exposure apparatus of the scanning exposure type.

Figure 11A:
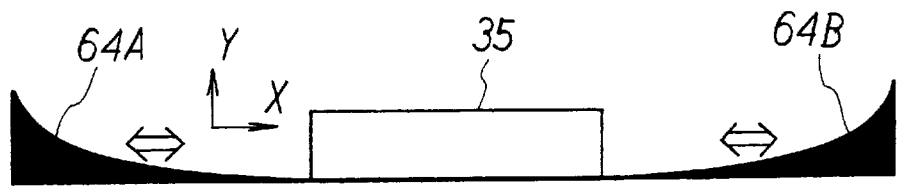
FIGS. 11A to 11D show shielding lines and operation thereof according to a second modified embodiment.
Figure 11B:
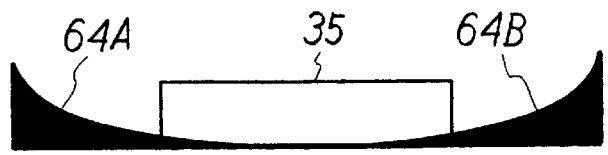
Figure 11C:
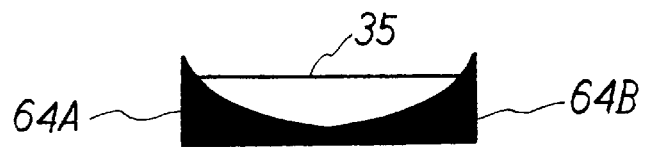

FIG. 11A shows an uneven illuminance-correcting plate of a second modified embodiment. With reference to FIG. 11A, shielding lines 64A, 64B for correcting the concave uneven illuminance, in which the line width is gradually changed in the non-scanning direction (X direction), are depicted on unillustrated two transmissive substrates. The shielding lines 64A, 64B (unillustrated substrates) are constructed so that they may be continuously driven independently in the X direction with respect to the illumination area 35 on the reticle. In this modified embodiment, in order to correct the concave uneven illuminance in the non-scanning direction, the shielding lines 64A, 64B are gradually moved inwardly in the X direction as shown in FIGS. 11B and 11C depending on the increase in degree of the uneven illuminance. When the two shielding lines 64A, 64B are arranged centrally asymmetrically with respect to the illumination area 35 as described above, the telecentric discrepancy can be also corrected continuously together with the concave uneven illuminance.

Figure 11D:

Further, as shown in FIG. 11D, a shielding line 65 for correcting the convex uneven illuminance is arranged movably in the X direction. The shielding line 65 is combined with the shielding lines 64A, 64B for correcting the convex uneven illuminance described above. Thus, it is possible to correct the uneven illuminance of various characteristics and the telecentric discrepancy.

Figure 12A:
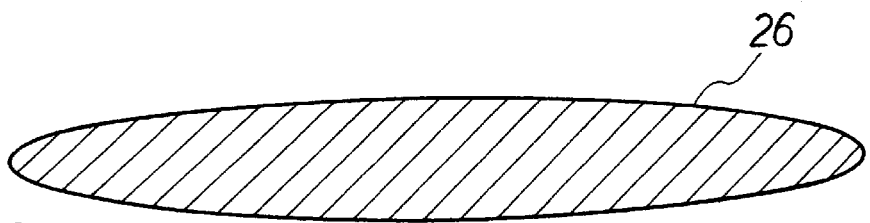
FIG. 12A shows a magnified view illustrating the shielding line 26 according to the embodiment shown in FIG. 2.
Figure 12B:
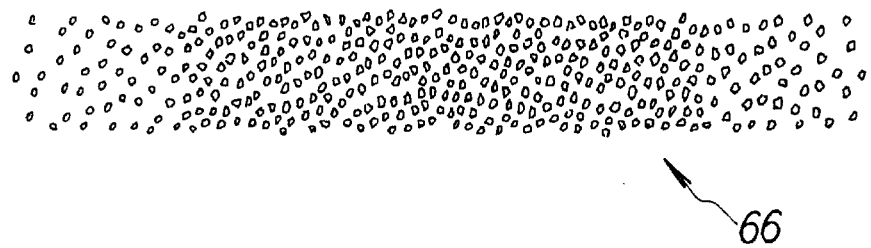
FIG. 12B shows a magnified view illustrating a shielding pattern 66 composed of a pattern of a large number of dots according to a third modified embodiment.

FIG. 12 shows a shielding line of a third modified embodiment. FIG. 12A illustrates the shielding line 26 used in the embodiment shown in FIG. 8. FIG. 12B illustrates a shielding pattern 66 in which identical dot patterns composed of a large number of minute shielding films are depicted with a density distribution to make change, for example, substantially in a form of quadratic function with respect to the non-scanning direction so as to possess substantially the same shielding characteristic as that of the shielding line 26. The shielding pattern 66 can be used in place of the shielding line 26. Accordingly, it is possible to further reduce the uneven illuminance during the static exposure.

As for the shielding pattern 66, the spacing distances between the respective adjoining dot patterns are set as randomly as possible so that no uneven illuminance is caused by the occurrence of any speckle pattern in the illumination area on the reticle. In place of the control of the density distribution of the large number of identical dot patterns, a large number of dot patterns, which have different sizes and different shapes, may be arranged at a density of an approximately identical number. A large number of dot patterns, which have different concentrations (transmittances), may be arranged at a density of an approximately identical number. In order to change the concentration (transmittance), for example, the thickness of a chromium film as the light-shielding film may be changed.

Next, explanation will be made with reference to FIGS. 13 and 14 for another example of the embodiment of the present invention. In the embodiment described above, in order to satisfy the condition of the expression (1) in which the exposure is performed with the integral number of pulses for the respective points on the wafer W, the shape of the opening 17a of the fixed blind 17 shown in FIG. 2 resides in the rectangular area with the constant width in the scanning direction. On the contrary, as shown in FIG. 13A, a fixed blind 17 of this embodiment is formed with an opening 17b in which the width in the scanning direction SD changes so that the previously measured uneven illuminance in the non-scanning direction is offset.

Figure 13A:
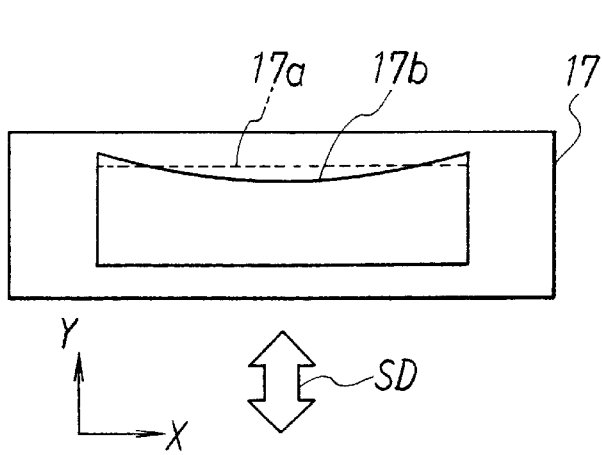
FIG. 13A shows an opening 17b of a fixed blind 17 according to another embodiment of the present invention.
Figure 13B:
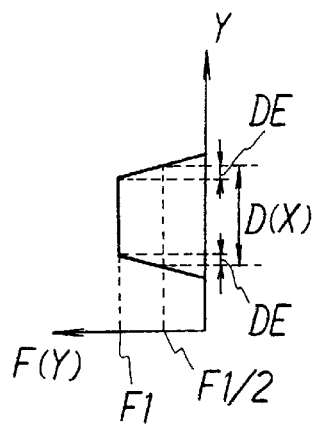
FIG. 13B shows an illuminance distribution in an exposure area on a wafer corresponding thereto.

A trapezoidal polygonal line 67 shown in FIG. 13B indicates an illuminance distribution F(Y) in the scanning direction (Y direction) at a certain position X in the non-scanning direction of the exposure area as a projected image of the opening 17b shown in FIG. 13A onto the wafer. With reference to FIG. 13B, the width (slit width) D(X) in the scanning direction at the position at which the illuminance is F1/2 with respect to the maximum illuminance F1 is the width of the exposure area at the position X in this embodiment as well. When the opening of the fixed blind 17 is the rectangular opening 17a indicated by dotted line, the slit width is constant irrelevant to the position X. However, the slit width D(X) of this embodiment changes depending on the position X. Under this condition, in order to substantially satisfy the condition to perform the exposure with an integral number of pulses in the expression (1) at the respective points on the wafer, attention is paid in this embodiment to the fact that the width DE in the scanning direction of an inclined portion of the trapezoidal illuminance distribution F(Y) shown in FIG. 13B is substantially constant irrelevant to the position X. The condition to perform the exposure with an integral number of pulses is imposed on the width DE. That is, the exposure is performed with a common integral number of pulses for the respective points during a period in which the respective points on the wafer W are moved by the width DE in the scanning direction.

Figure 14A:
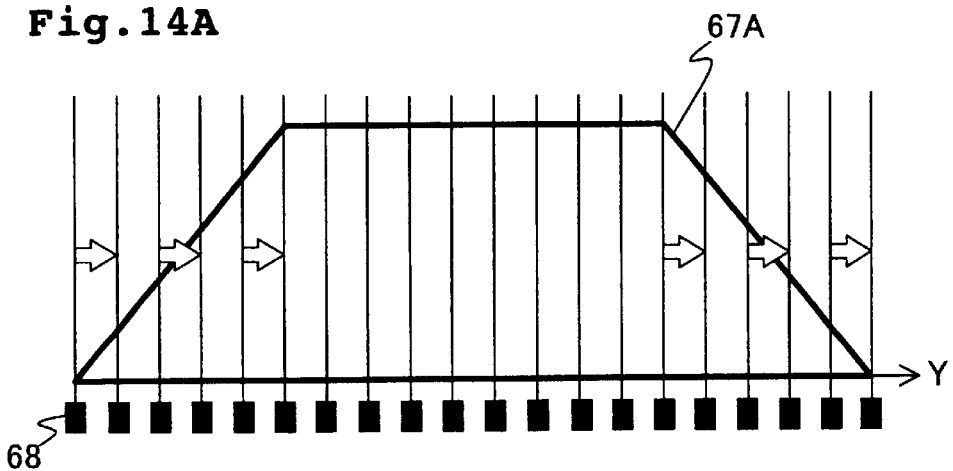
FIG. 14A shows an example of the timing of pulse light emission in the embodiment shown in FIG. 2.

FIG. 14 shows an example of the timing of the pulse light emission during the scanning exposure in this embodiment, and a comparative example. At first, a polygonal line 67A shown in FIG. 14A indicates an illuminance distribution in the scanning direction of the exposure area when the slit width is constant in the non-scanning direction as in the embodiment shown in FIG. 2. When the scanning exposure is performed with the illuminance distribution shown in FIG. 14A, for example, the pulse light emission of the exposure light beam is performed every time when predetermined one point on the wafer arrives at a position 68 in the Y direction at an approximately equal interval.

Figure 14B:
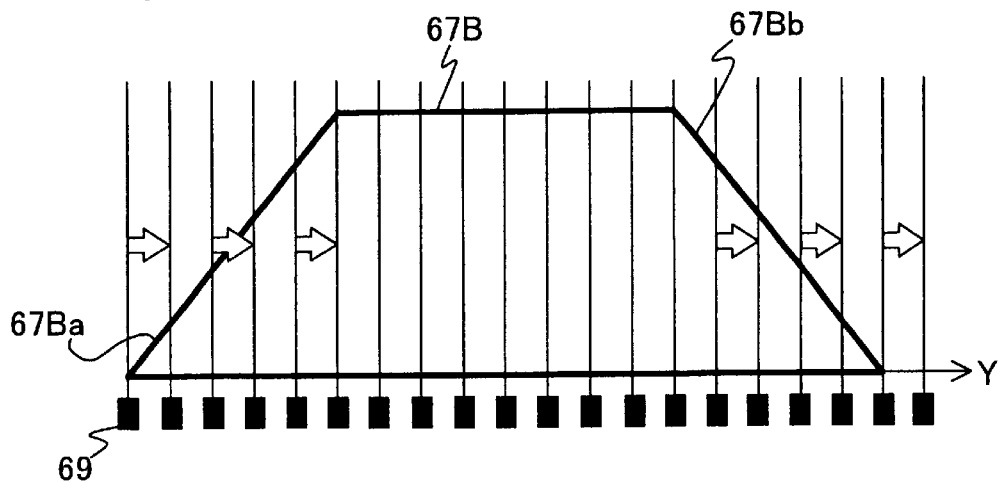
FIG. 14B shows an example of the timing of pulse light emission in the embodiment shown in FIG. 13.

On the other hand, a polygonal line 67B shown in FIG. 14B indicates an illuminance distribution in the scanning direction of the exposure area at a certain position X when the slit width is changed in the non-scanning direction as in FIG. 13B of this embodiment. When the scanning exposure is performed with the illuminance distribution shown in FIG. 14B, the exposure is performed with an integral number of pulses during the period in which the respective points on the wafer pass over inclined portions 67Ba, 67Bb of the trapezoidal illuminance distribution indicated by the polygonal line 67B respectively. Specifically, the pulse light emission of the exposure light beam is performed every time when predetermined one point on the wafer arrives at the position 69 in the Y direction at an approximately equal interval. Accordingly, the exposure is performed with an identical number of pulses (five individuals in FIG. 14B) for the rising inclined portion 67Ba and the falling inclined portion 67Bb of the trapezoidal illuminance distribution. Thus, the totalized exposure amount distribution is made to be uniform.

As described above, for example, the following methods are conceived in order that the number of exposure pulses is the integral number at the inclined portion with the width DE of the trapezoidal illuminance distribution, i.e., (A) the method in which the scanning velocity of the wafer stage 39 shown in FIG. 1 is changed, (B) the method in which the pulse light emission frequency of the exposure light source 1 is changed, and (C) the method in which the width DE of the inclined portion of the trapezoidal illuminance distribution shown in FIG. 14B is changed. Among these method, the throughput is sometimes lowered in the case of the method in which the scanning velocity is changed as in the method (A). The method (C) is sometimes difficult to be used, because the width of the inclined portion of the illuminance distribution is changed, for example, when the modified illumination is performed. Therefore, the method (B), in which the pulse light emission frequency is changed, is considered to be most practical.

In the embodiment described above, both of the uneven illuminance and the telecentric discrepancy amount are corrected. However, only any one of them may be corrected. Further, the telecentric discrepancy amount may be divided into its components concerning the X direction and the Y direction, and only any one of them may be corrected in some cases.

In the embodiment described above, the fly's eye lenses 6, 9 are used as the optical integrator. However, it is clear that the present invention is also applicable when an inner surface-reflecting type integrator (rod integrator) is used as the optical integrator. Further, the embodiment described above is based on the use of the illumination optical system ILS of the so-called double fly's eye lens system in which the fly's eye lens system 6, 9 disposed at the two stages are used. However, the present invention is also applicable when an illumination optical system is used, which is based on the use of only one stage optical integrator (for example, a fly's eye lens and a rod integrator). Further, the diffractive optical element (DOE) described above may be used as the optical integrator not only for the modified illumination but also, for example, for the ordinary illumination and the small a value illumination. Of course, in this case, it is desirable that a plurality of diffractive optical elements are prepared, and they are exchanged depending on the illumination condition.

In the embodiment described above, the projection optical system PL may form an intermediate image of the reticle pattern at least once between the object plane (reticle plane) and the image plane (wafer plane). In this case, at least one of the uneven illuminance-correcting plates 23A, 23B and the rough uneven illuminance-correcting plate 24 may be arranged while being defocused from the intermediate image plane by a predetermined spacing distance. In addition thereto or singly, at least one of the movable blind 13 and the fixed blind 17 may be arranged at the intermediate image plane or a plane defocused by a predetermined spacing distance therefrom.

In the embodiment described above, the present invention is applied to the projection exposure apparatus based on the scanning exposure system. However, the present invention is also applicable to an exposure apparatus based on, for example, the proximity system in which no projection system is used. Further, the exposure light beam (exposure beam) is not limited to the ultraviolet light beam described above. For example, the EUV light beam in the soft X-ray region (wavelength: 5 to 50 nm) generated from the SOR (Synchrotron Orbital Radiation) ring or the laser plasma light source may be used. In the case of the EUV exposure apparatus, the illumination optical system and the projection optical system are constructed by only a plurality of reflective optical elements respectively. Further, for example, the rough uneven illuminance-correcting plate and the uneven illuminance-correcting plate described above are also those of the reflecting type.

A semiconductor device can be produced from the wafer W shown in FIG. 1. The semiconductor device is produced by performing, for example, a step of designing the function and the performance of the device, a step of producing a reticle based on the foregoing step, a step of manufacturing the wafer from a silicon material, a step of exposing the wafer with a pattern on the reticle by using the projection exposure apparatus of the embodiment described above, a step of assembling the device (including a dicing step, a bonding step, and a packaging step), and an inspection step.

The way of use of the exposure apparatus is not limited to the exposure apparatus for producing the semiconductor element. The present invention is also widely applicable, for example, to the exposure apparatus for the liquid crystal display element formed on an angular glass plate or for the display device such as the plasma display, and the exposure apparatus for producing various devices including, for example, the image pickup element (for example, CCD), the micromachine, and the thin film magnetic head. Further, the present invention is also applicable to the exposure step (exposure apparatus) to be used when the mask (for example, photomask and reticle) formed with the mask pattern of various devices is produced by using the photolithography step.

It is a matter of course that the present invention is not limited to the embodiments described above, which may be embodied in other various forms without deviating from the gist or essential characteristics of the present invention. For example, an opening shape of a fixed blind disclosed in Japanese Patent Application Laid-Open No. 7-142313 and EP 0,633,506 A1 corresponding thereto may be utilized in combination with the present invention. Disclosure of these documents is incorporated herein by reference.

According to the present invention, the transmittance distribution in the non-scanning direction with respect to the exposure light beam can be controlled when the exposure is performed in accordance with the scanning exposure system. Accordingly, it is possible to enhance the uniformity of the totalized exposure amount distribution on the substrate (wafer) after the scanning exposure or the telecentricity of the exposure light beam (exposure beam). Therefore, it is possible to mass-produce the device having the high function at a high yield.

When the width in the scanning direction of the exposure area of the exposure light beam is defined so that the exposure light beam is radiated substantially with the integral number of pulses during the period in which the point on the substrate passes over the exposure area, it is possible to enhance the uniformity of the totalized exposure amount on the substrate when the scanning exposure is performed by using the pulse light beam as the exposure light beam.

According to the present invention, even when the variation of the transmittance (including the variation of the reflectance) of the optical member occurs on the optical path of the exposure light beam, the transmittance is controlled so that the variation amount is offset. Accordingly, it is possible to easily enhance the uniformity of the totalized exposure amount after the scanning exposure on the substrate or the telecentricity of the exposure light beam.

According to the second exposure method of the present invention, for example, when the distribution of the totalized exposure amount is controlled by gradually changing the width of the exposure area on the substrate in the non-scanning direction, it is possible to satisfy the condition to perform the exposure substantially in the amount corresponding to the integral number of pulses for the respective points on the substrate. Thus, the uniformity of the totalized exposure amount distribution is improved.

What is claimed is:

1. An exposure method for exposing a substrate with an exposure light beam by illuminating a mask with the exposure light beam and scanning the substrate with the exposure light beam via the mask while moving the substrate in a scanning direction, the exposure method comprising:

controlling an intensity distribution of the exposure light beam with a transmittance distribution control member which is arranged on an optical path of the exposure light beam to the substrate, and which has a variable transmittance distribution, to adjust an illuminance distribution of the exposure light beam in a non-scanning direction that intersects the scanning direction;

wherein the transmittance distribution control member has a pattern arranged on a predetermined area, through which the exposure light beam passes, so that a transmittance distribution in a first direction corresponding to the scanning direction is different depending on a position in a second direction corresponding to the non-scanning direction, and a proportion of the predetermined area occupied by the pattern in the first direction is changed in the second direction; and synchronously moving the mask and the substrate with respect to the exposure light beam to scan the substrate across the exposure light beam having the controlled intensity distribution.

2. The exposure method according to claim 1, wherein:
the exposure light beam is a pulse light beam; and
a width in the scanning direction of an exposure area of the exposure light beam on the substrate is determined so that the exposure light beam is radiated substantially as an integral number of pulses at any point to be exposed during a period in which the point on the substrate passes the exposure area.

3. The exposure method according to claim 1, wherein the intensity distribution for the exposure light beam is controlled with the transmittance distribution control member after uniformity of an illuminance distribution of the exposure light beam is enhanced by the aid of at least one optical integrator.

4. The exposure method according to claim 1, wherein illuminance distribution of the exposure light beam on the substrate in the non-scanning direction is adjusted by controlling the intensity distribution of the exposure light beam with the transmittance distribution control member so that a distribution of exposure amount on the substrate is substantially uniform.

5. The exposure method according to claim 1, wherein a collapse amount of telecentricity of the exposure light beam with respect to the mask or the substrate is corrected by controlling the transmittance distribution in the first direction for the transmittance distribution control member.

6. The exposure method according to claim 1, wherein the pattern of the transmittance distribution control member is arranged on a predetermined plane apart from a pattern plane of the mask or a conjugate plane conjugate with the pattern plane by a predetermined spacing distance, and the mask is illuminated with the exposure light beam via the transmittance distribution control member.

7. The exposure method according to claim 6, wherein the transmittance distribution control member partially shields the exposure light beam with the pattern thereof, and the pattern is at least one line pattern with a width in the first direction that changes in the second direction or an aggregate of minute dot patterns with a density or a size changing in the second direction.

8. The exposure method according to claim 6, wherein:
the transmittance distribution control member partially shields the exposure light beam with the pattern thereof,
the pattern includes a first set of a plurality of line patterns in each of which a shielding area is changed in the second direction, and a second set of a plurality of line patterns each of which has substantially the same shape as that of one of the line patterns of the first set; and the first set of the plurality of line patterns and the second set of the plurality of line patterns extend substantially in the second direction, respectively, and are arranged apart from each other in the first direction.

9. The exposure method according to claim 8, wherein the plurality of line patterns of the first set and the second set are moved in the first direction to correct an irregularity component of an uneven illuminance of the exposure light beam, and are moved in the second direction to correct an inclination component of the uneven illuminance.

10. The exposure method according to claim 8, wherein the plurality of line patterns in the first set are arranged at a different spacing distance in the first direction.

11. The exposure method according to claim 8, wherein:
the exposure light beam is a pulse light beam; and
the first set of the plurality of line patterns are arranged at spacing distances therebetween in the first direction which are different respectively both from a length obtained by converting a spacing distance of movement of the substrate during pulse oscillation of the exposure light beam into a spacing distance and from an integral multiple of the converted spacing distance.

12. The exposure method according to claim 8, wherein:
the transmittance distribution control member further comprises, in addition to the first set and the second set of the plurality of line patterns, a plurality of line patterns which are different in at least shielding area and shape from each other, each of which extends in the second direction, and each of which has a shielding light width in the first direction that changes in the second direction; and
one of the plurality of line patterns is arranged on the optical path of the exposure light beam, in order to roughly correct any uneven illuminance of the exposure light beam in the non-scanning direction.

13. The exposure method according to claim 1, wherein the intensity distribution of the exposure light beam is controlled with the transmittance distribution control member to adjust the illuminance distribution of the exposure light beam in the non-scanning direction depending on change of condition for illuminating the mask with the exposure light beam.

14. A method for producing a device, comprising a step of transferring a device pattern onto a workpiece by using the exposure method as defined in claim 1.

15. The exposure method according to claim 1, further comprising:
changing a positional relationship between the exposure light beam and the pattern by driving the transmittance distribution control member and measuring the illuminance distribution of the exposure light beam;
determining, based on a result of the illuminance distribution measurement, a relationship between a driving amount otto transmittance distribution control member and a changed amount of the illuminance distribution; and
the step of adjusting the illuminance distribution includes adjusting the positional relationship by using the determined relationship.

16. The exposure meted according to claim 15, further comprising:
calculating the illuminance distribution which will change after the measurement of the illuminance distribution and before a next measurement of the illuminance distribution; and
adjusting the positional relationship based on the calculated illuminance distribution.

17. The exposure method according to claim 1, wherein the illuminance distribution of the exposure light beam in the scanning direction on the substrate has a substantially trapezoidal shape, and the exposure light beam is a pulse light beam, the exposure method further comprising:
determining a scanning exposure condition of the substrate so that an integral number of pulses of the exposure light beam is radiated to a predetermined point on the substrate during a period in which the predetermined point passes over an inclination portion of the illumination distribution.

18. The exposure method according to claim 17, wherein the scanning exposure condition is determined so that a same number of the pulses is radiated to the predetermined point in both of inclination portions at respective ends of the illumination distribution with respect to the scanning direction.

19. The exposure method according to claim 1, wherein:
the pattern of the transmittance distribution control member includes a pair of first pattern groups which extend in the second direction and which are arranged apart from each other in the first direction; and
a positional relationship between the pair of first pattern groups and the exposure light beam is changed when the illuminance distribution is adjusted.

20. The exposure method according to claim 19, wherein:
the pair of first pattern groups has a plurality of line patterns in each of which a width in the first direction is changed in the second direction; and
a tendency in width change in one first pattern group of the pair is opposite to that in the other first pattern group of the pair.

21. The exposure method according to claim 19, wherein:
the pattern of the transmittance distribution control member includes a pair of second pattern groups which is different from the pair of first pattern groups, the pair of second pattern groups extending in the second direction and arranged apart from each other in the first direction; and
at least two pattern groups of the pair of first pattern groups and the pair of second pattern groups are used to adjust the illuminance distribution.

22. The exposure method according to claim 21, wherein:
the pair of first pattern groups and the pair of second pattern groups have a plurality of line patterns in each of which a width in the first direction is changed in the second direction, respectively; and
a pair of pattern groups, in which a tendency in width change is identical to or opposite from each other, is used to adjust the illuminance distribution.

23. The exposure method according to claim 21, wherein:
the pair of first pattern groups and the pair of second pattern groups have a plurality of line patterns in each of which a width in the first direction is changed in the second direction, respectively;
a tendency in width change in one first pattern group of the pair is opposite to that in the other first pattern group of the pair; and
the plurality of line patterns of the pair of second pattern groups is arranged in an opposite manner firm that of the pair of first pattern groups.

24. The exposure method according to claim 1, wherein:
the pattern of the transmittance distribution control member includes at least one pair of pattern groups which extend in the second direction and which are arranged apart from each other in the first direction, and a plurality of patterns which are arranged exchangeably on the optical path of the exposure light beam; and
at least one of the pair of pattern groups and one of the plurality of patterns is used to adjust the illuminance distribution.

25. An exposure apparatus for exposing a substrate with an exposure light beam radiated horn a light source on a mask by synchronously moving the mask and the substrate, the exposure apparatus comprising:
a transmittance distribution control member which is ranged on an optical path of the exposure light beam to the substrate to adjust an illuminance distribution of the exposure light beam in a non-scanning direction intersecting a scanning direction of the substrate,
wherein the transmittance distribution control member has a pattern arranged on a predetermined area, through which the exposure light beam passes, so that a transmittance distribution of a first direction corresponding to the scanning direction is different depending on a position of a second direction corresponding to the non-scanning direction, and a proportion of the predetermined area occupied by the pattern in the first direction is changed in the second direction; and
a driving wilt which drives the transmittance distribution control member in order to adjust a positional relationship between the exposure light beam and the pattern.

26. The exposure apparatus according to claim 25, wherein:
the light source pulse-oscillates the exposure light beam;
the pattern of the transmittance distribution control member is ranged on a predetermined plane apart from a pattern plane of the mask or a conjugate plane conjugate with the pattern plane by a predetermined spacing distance; and
a width of the exposure light beam in an exposure area on the substrate in the scanning direction is determined so that the exposure light beam is radiated substantially as an integral number of pulses to any point to be exposed during a period in which the point on the substrate passes the exposure area.

27. The exposure apparatus according to claim 25, further comprising an illumination optical system arranged between the light source and the mask,
wherein the transmittance distribution control member is arranged between an optical integrator at the illumination optical system and the substrate.

28. The exposure apparatus according to claim 27, further comprising a shaping optical system including a zoom optical system and a plurality of diffractive optical elements which is switchably arranged in the illumination optical system, the shaping optical system being arranged between the light source and the optical integrator in the illumination optical system in order to change an illumination condition of the mask with the exposure light beam,
wherein a transmittance distribution of the exposure light beam is controlled with an adjustment of the positional relationship between the exposure light beam and the pattern depending on a change of the illumination condition to adjust the illumination distribution of the exposure light beam.

29. The exposure apparatus according to claim 28, wherein the illuminance distribution of the exposure light beam in the scanning direction on the substrate has a substantially trapezoidal shape, the exposure apparatus further comprising a control unit which determines a scanning exposure condition of the substrate so that an integral number of pulses of the exposure light beam is radiated to a predetermined point on the substrate during a period in which the predetermined point passes over an inclination portion of the illumination distribution.

30. The exposure apparatus according to claim 29, wherein the scanning exposure condition is determined so that a same number of the pulses is radiated to the predetermined portion in the respective inclination point at both ends of the illumination distribution with respect to the scanning direction.

31. The exposure apparatus according to claim 25, wherein the transmittance distribution control member partially shields the exposure light bean, with the pattern thereof the pattern is at least one line pattern with a width in the first direction that changes in the second direction, or an aggregate of minute dot patterns with a density or a size changing in the second direction.

32. The exposure apparatus according to claim 25, wherein:
the transmittance distribution control member partially shields the exposure light beam with the pattern thereof;
the pattern includes a first set of a plurality of line patterns in each of which a shielding area is changed in the second direction, and a second set of a plurality of line patterns each of which has substantially the same shape as that of one of the line patterns of the first set; and
the first set of the plurality of line patterns and the second set of the plurality of line patterns extend substantially in the second direction, respectively, and are arranged apart from each other in the first direction.

33. The exposure apparatus according to claim 32, wherein the driving unit moves the first set and the second set of the plurality of line patterns in the first direction to correct an irregularity component of an uneven illuminance of the exposure light beam, and moves the first set and the second set of the plurality of line patterns in the second direction to correct an inclination component of the uneven illuminance.

34. The exposure apparatus according to claim 33, wherein the transmittance distribution control member further comprises, in addition to the fist set and the second set of the plurality of line patterns, a plurality of line patterns which are different in at least shielding area and shape from each other, each of which extends in the second direction, and each of which has a shielding light width in the first direction that changes in the second direction and
one of the plurality of line patterns is arranged on the optical path of the exposure light beam, in order to roughly correct any uneven illuminance of the exposure light beam in the non-scanning direction.

35. The exposure apparatus according to claim 25, wherein the driving unit moves the pattern by driving the transmittance distribution control member in the first direction in order to correct any discrepancy of telecentricity of the exposure light beam with respect to the mask or the substrate.

36. The exposure apparatus according to claim 32, wherein the driving unit makes a moving amount of the first set of the plurality of line patterns different from a moving amount of the second set of the plurality of line patterns to adjust a telecentricity of the exposure light beam.

37. The exposure apparatus according to claim 32, wherein:
the light source pulse-oscillates the exposure light beam;
the transmittance distribution control member is arranged on a predetermined plane apart at a predetermined spacing distance from a conjugate plane conjugate with the substrate; and
the first set and the second set of the plurality of line patterns are respectively arranged at spacing distances therebetween in the first direction which are different, respectively, both from a length obtained by converting a spacing distance of movement of the substrate during the pulse-oscillation of the exposure light beam into a spacing distance and from an integral multiple of the converted spacing distance.

38. The exposure apparatus according to claim 32, wherein the plurality of line patterns in the first set is arranged at a different spacing distance from each other in the first direction, and the plurality of line patterns in the second set is arranged at a different spacing distance from each other in the first direction.

39. The exposure apparatus according to claim 25, wherein:
the pattern of the transmittance distribution control member includes a pair of first pattern groups which extend in the second direction and which are arranged apart from each other in the first direction; and
a positional relationship between the pair of first pattern groups and the exposure light beam is changed when the illuminance distribution is adjusted.

40. The exposure apparatus according to claim 39, wherein:
the pair of first pattern groups has a plurality of line patterns in each of which a width in the first direction is changed in the second direction; and
a tendency in width change in one first pattern group of the pair is opposite to that in the other first pattern group of the pair.

41. The exposure apparatus according to claim 39, wherein:
the pattern of the transmittance distribution control member includes a pair of second pattern groups which is different from the pair of first pattern groups, the pair of second pattern groups extending in the second direction and arranged apart from each other in the first direction; and
at least two pattern groups of the pair of first pattern groups and the pair of second pattern groups are used to adjust the illuminance distribution.

42. The exposure apparatus according to claim 41, wherein:
the pair of first pattern groups and the pair of second pattern groups have a plurality of line patterns in each of which a width in the first direction is changed in the second direction, respectively; and
a pair of pattern groups, in which a tendency in width change is identical to or opposite from each other, is used to adjust the illuminance distribution.

43. The exposure apparatus according to claim 41, wherein:
the pair of first pattern groups has a plurality of line patterns in each of which a width in the first direction is changed in the second direction;
a tendency in width change in one first pattern group of the pair is opposite to that in the other first pattern group of the pair; and
the plurality of tine patterns of the pair of second pattern groups is arranged in an opposite manna from that of the pair of first pattern groups.

44. The exposure apparatus according to claim 25, wherein:
- the pattern of the transmittance distribution control member includes at least one pair of pattern groups which extend in the second direction and which are arranged apart from each other in the first direction, and a plurality of patterns which are arranged exchangeably on the optical path of the exposure light beam; and
- at least one of the pair of pattern groups and one of the plurality of patterns is used to adjust the illuminance distribution.

45. An exposure apparatus for illuminating a mask with an exposure light beam and exposing a substrate with the exposure light beam via the mask, the exposure apparatus comprising:
- a transmittance distribution control member which has a pattern arranged on a predetermined plane apart from a conjugate plane conjugate with the substrate by a predetermined spacing distance and which has a variable transmittance distribution with respect to the exposure light beam on the predetermined plane, wherein a proportion of the predetermined area occupied by the pattern through which the exposure tight beam passes in a first direction is changed in a second direction intersecting the first direction; and
- an adjusting unit which controls the transmittance distribution of the exposure light beam with an adjustment of a positional relationship between the exposure light beam and the pattern so as to correct at least one of uneven illuminance and a collapse amount of telecentricity of the exposure light beam with respect tote mask or the substrate.

46. The exposure apparatus according to claim 45, further comprising an illumination optical system which is arranged between the mask and a light source which pulse-oscillates the exposure light beam,
- wherein the transmittance distribution control member is arranged between an optical integrator of the illumination optical system and the substrate.

47. The exposure apparatus according to claim 46, further comprising a shaping optical system which includes a zoom optical system and a plurality of diffractive optical elements which is switchably arranged in the illumination optical system, the shaping optical system being arranged between the light source and the optical integrator in the illumination optical system in order to change an illumination condition of the mask with the exposure light beam,
- wherein the adjusting unit controls a transmittance distribution of the exposure light beam according to a change of the illumination condition.

48. The exposure apparatus according to claim 45, wherein:
- the transmittance distribution control member partially shields the exposure light beam with the pattern thereof; and
- the pattern includes a first set of a plurality of line patterns which extends in the second direction and having a width of shielding light in the first direction that changes in the second direction, and a second set of a plurality of line patterns each of which has substantially the same shape as that of one of the line patterns of the first set and which is arranged apart from the first set of the plurality of line patterns in the first direction.

49. The exposure apparatus according to claim 48, wherein the first set and the second set of the plurality of line patterns are moved in the first direction to correct an irregularity component of the uneven illuminance, and are moved in the second direction to correct an inclination component of the uneven illuminance.

50. The exposure apparatus according to claim 48, wherein the first set and the second set of the plurality of line patterns are moved in the first direction to correct the collapse amount of telecentricity.

51. The exposure apparatus according to claim 50, wherein a moving amount of the first set of the plurality of line patterns in the first direction and a moving amount of the second set of the plurality of line patterns in the first direction are made different from each other.

52. The exposure apparatus according to claim 48, wherein the transmittance distribution control member farther comprises, in addition to the first set and the second set of the plurality of line patterns, a plurality of line patterns which are different in at least shielding area and shape from each other, each of which extends in the second direction, and each of which has a shielding light width in the first direction that changes in the second direction; and
- one of the plurality of line patterns is arranged on the optical path of the exposure light beam, in order to roughly correct the uneven illuminance.

* * * * *

UNITED STATES PATENT AND TRADEMARK OFFICE
CERTIFICATE OF CORRECTION

PATENT NO. : 6,704,090 B2
DATED : March 9, 2004
INVENTOR(S) : Kenji Nishi

It is certified that error appears in the above-identified patent and that said Letters Patent is hereby corrected as shown below:

Column 37,
Line 62, after "thereof", change "," to -- ; --.

Column 38,
Line 54, change "otto" to -- of the --.

Column 39,
Line 61, change "firm" to -- from --.

Column 40,
Line 9, change "horn" to -- from --.
Line 13, change "ranged" to -- arranged --.
Line 26, change "wilt" to -- unit --.
Line 33, change "ranged" to -- arranged --.

Column 41,
Line 16, change "bean" to -- beam --.
Line 17, after "thereof" insert -- , --.
Line 50, change "direction and" to -- direction; and --.

Column 42,
Line 65, change "tine" to -- line --.
Line 66, change "manna" to -- manner --.

Column 43,
Line 23, change "tight" to -- light --.
Line 31, change "tote" to -- to the --.

UNITED STATES PATENT AND TRADEMARK OFFICE
CERTIFICATE OF CORRECTION

PATENT NO. : 6,704,090 B2
DATED : March 9, 2004
INVENTOR(S) : Kenji Nishi

It is certified that error appears in the above-identified patent and that said Letters Patent is hereby corrected as shown below:

<u>Column 44,</u>
Lines 35□36, change "farther" to -- further --.

Signed and Sealed this

Twenty-fifth Day of May, 2004

JON W. DUDAS
*Acting Director of the United States Patent and Trademark Office*